US012588351B2

(12) United States Patent
Tsuno et al.

(10) Patent No.: US 12,588,351 B2
(45) Date of Patent: Mar. 24, 2026

(54) ELECTRONIC DEVICE AND METHOD FOR MANUFACTURING ELECTRONIC DEVICE

(71) Applicant: SONY SEMICONDUCTOR SOLUTIONS CORPORATION, Kanagawa (JP)

(72) Inventors: Hitoshi Tsuno, Kanagawa (JP); Hideaki Togashi, Kanagawa (JP); Tomohiro Ohkubo, Kanagawa (JP); Masayuki Kurita, Kanagawa (JP); Syuto Tamura, Kanagawa (JP); Nobuhiro Kawai, Kanagawa (JP); Tomoki Hiramatsu, Kanagawa (JP); Masahiro Joei, Kanagawa (JP); Kenichi Murata, Kanagawa (JP); Hideki Tsujiai, Kanagawa (JP); Tetsuro Takada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 379 days.

(21) Appl. No.: 18/256,084

(22) PCT Filed: Dec. 8, 2021

(86) PCT No.: PCT/JP2021/045176
§ 371 (c)(1),
(2) Date: Jun. 6, 2023

(87) PCT Pub. No.: WO2022/131103
PCT Pub. Date: Jun. 23, 2022

(65) Prior Publication Data
US 2024/0032316 A1 Jan. 25, 2024

(30) Foreign Application Priority Data
Dec. 16, 2020 (JP) .................................. 2020-208024

(51) Int. Cl.
H10K 39/38 (2023.01)
H10K 39/00 (2023.01)
H10K 39/32 (2023.01)

(52) U.S. Cl.
CPC ............. *H10K 39/38* (2023.02); *H10K 39/32* (2023.02); *H10K 39/401* (2023.02)

(58) Field of Classification Search
CPC .................................................... H10K 39/38
(Continued)

(56) References Cited

U.S. PATENT DOCUMENTS

| | | | | |
|---|---|---|---|---|
| 2006/0219607 A1* | 10/2006 | Sato | ....................... | B82Y 10/00 |
| | | | | 257/E27.111 |
| 2011/0220891 A1* | 9/2011 | Fujii | .................... | H10D 86/441 |
| | | | | 438/161 |
| 2020/0303432 A1* | 9/2020 | Shibuta | ............... | H10F 39/8067 |

FOREIGN PATENT DOCUMENTS

| | | |
|---|---|---|
| JP | 06-181209 A | 6/1994 |
| JP | 2004-233683 A | 8/2004 |

(Continued)

OTHER PUBLICATIONS

International Search Report and Written Opinion of PCT Application No. PCT/JP2021/045176, issued on Mar. 15, 2022, 11 pages of ISRWO.

*Primary Examiner* — Stanley Tso
(74) *Attorney, Agent, or Firm* — CHIP LAW GROUP

(57) ABSTRACT

Light reduction in a wiring part connected to an optical device of an electronic device including the optical device is prevented. The electronic device includes an insulating layer, an interlayer connection wiring, and an upper layer wiring. The insulating layer is disposed adjacent to the lower layer wiring and includes a through hole. The interlayer connection wiring is a transparent wiring that is connected to the lower layer wiring in the through hole and is formed (Continued)

into a shape extending to a surface side of the insulating layer. The upper layer wiring is a transparent wiring that is stacked and connected to the interlayer connection wiring extending to the surface side of the insulating layer.

18 Claims, 14 Drawing Sheets

(58) Field of Classification Search
USPC ........................................................ 174/68.1
See application file for complete search history.

(56) References Cited

FOREIGN PATENT DOCUMENTS

| | | | |
|---|---|---|---|
| JP | 2006-261240 | A | 9/2006 |
| JP | 2011-211187 | A | 10/2011 |
| JP | 2012-255960 | A | 12/2012 |
| JP | 2017-208496 | A | 11/2017 |
| JP | 2017-228621 | A | 12/2017 |
| WO | 2017/169314 | A1 | 10/2017 |

* cited by examiner

ELECTRONIC DEVICE AND METHOD FOR MANUFACTURING ELECTRONIC DEVICE

CROSS REFERENCE TO RELATED APPLICATIONS

This application is a U.S. National Phase of International Patent Application No. PCT/JP2021/045176 filed on Dec. 8, 2021, which claims priority benefit of Japanese Patent Application No. JP 2020-208024 filed in the Japan Patent Office on Dec. 16, 2020. Each of the above-referenced applications is hereby incorporated herein by reference in its entirety.

FIELD

The present disclosure relates to an electronic device and a method for manufacturing an electronic device. The present invention specifically relates to an electronic device having an optical device and a method for manufacturing the electronic device.

BACKGROUND

Electronic devices having optical devices have been used. As such electronic devices, imaging apparatuses that convert incident light from a subject into an image signal by using a light receiving device and display apparatuses that display an image by using a light emitting device have been used. In these electronic devices, electronic circuits including a semi-conductor device are disposed on the back side of optical devices for downsizing. For example, for an imaging apparatus, an electronic device has been proposed in which a photoelectric conversion device formed of an organic photo-toelectric conversion film is disposed as an optical device on the back surface side of a semiconductor substrate on which an electronic circuit is formed (see Patent Literature 1, for example).

The photoelectric conversion device formed of an organic photoelectric conversion film is configured by sandwiching the organic photoelectric conversion film between transparent electrodes. The organic photoelectric conversion film absorbs incident light, for example, visible light to generate charges. The generated charges are transmitted to the electronic circuit of the semiconductor substrate via the transparent electrode and converted into an image signal. In the electronic device, the photoelectric conversion device is also disposed on the semiconductor substrate. Incident light, for example, infrared light transmitted through the photoelectric conversion device formed of an organic photoelectric conversion film is converted into an image signal by the photoelectric conversion device of the semiconductor substrate.

CITATION LIST

Patent Literature

Patent Literature 1: JP 2017-208496 A

SUMMARY

Technical Problem

However, in the above-described conventional technology, there is a problem that light entering the semiconductor substrate is reduced. This is because a wiring part that transmits a signal of the organic photoelectric conversion film disposed on the back surface side of the semiconductor substrate blocks entering of light to the semiconductor substrate.

The present disclosure proposes an electronic device that prevents reduction of light in a wiring part connected to an optical device, and a method for manufacturing the electronic device.

Solution to Problem

An electronic device according to the present disclosure includes: an insulating layer disposed adjacent to a lower layer wiring, the insulating layer including a through hole; a transparent interlayer connection wiring connected to the lower layer wiring in the through hole, the interlayer connection wiring formed into a shape extending to a surface side of the insulating layer; and a transparent upper layer wiring stacked on and connected to the interlayer connection wiring extending to the surface side of the insulating layer.

DESCRIPTION OF EMBODIMENTS

Hereinafter, embodiments of the present disclosure will be described in detail with reference to the drawings. The description will be given in the following order. In each of the following embodiments, the same portions are denoted by the same reference signs, and repetitive description are omitted.

1. First Embodiment
2. Second Embodiment
3. Third Embodiment
4. Fourth Embodiment
5. Fifth Embodiment
6. Sixth Embodiment
7. Seventh Embodiment
8. Application example to imaging device

1. First Embodiment

Configuration of Wiring Part

Figure 1A:
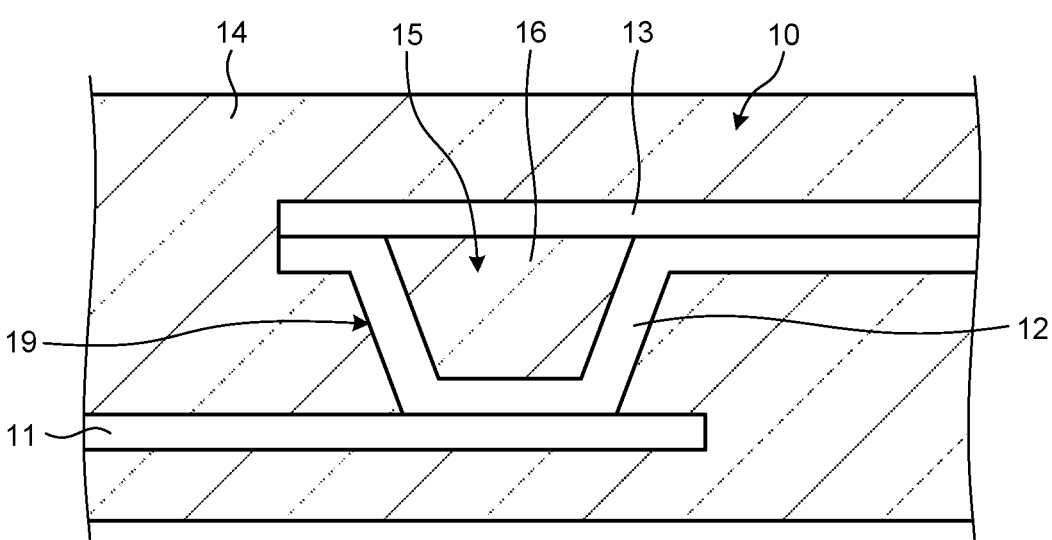
FIG. 1A is a sectional view illustrating a configuration example of a wiring part according to a first embodiment of the present disclosure.

FIG. 1A is a sectional view illustrating a configuration example of a wiring part according to a first embodiment of the present disclosure. The drawing is a diagram illustrating a configuration example of a wiring part used in an electronic device. The drawing is a diagram illustrating a configuration example of a wiring part 10 configured by performing interlayer connection of two wirings disposed in different layers. In the wiring part 10 in the drawing, a wiring 13 disposed adjacent to a wiring 11 is formed as a second layer of wiring. As described later, the wiring 11 and the wiring part 10 are assumed to be wirings to be connected to an imaging device which is an optical device. Thus, the wiring 11 and the wiring part 10 are formed of a transparent conductive film which is a transparent conductor. The wiring part 10 includes an insulating layer 14, an interlayer connection wiring 12, and the wiring 13. The wiring part 10 in the drawing further includes an embedded part 16.

The insulating layer 14 insulates conductive films constituting the wiring 11 and the wiring part 10. The insulating layer 14 is formed of a transparent member. The insulating layer 14 disposed between the wiring 11 and the interlayer connection wiring 12 constitutes an interlayer insulating film. The insulating layer 14 is formed with a through hole 19 that is disposed adjacent to the wiring 11 and has a shape reaching the wiring 11. The through hole 19 may be configured as an opening having a circular or rectangular shape.

The interlayer connection wiring 12 connects the wiring 11 and the wiring 13. The interlayer connection wiring 12 is connected to the wiring 11 in the through hole 19 and is formed into a shape extending to a surface side of the insulating layer 14 forming the interlayer insulating film. The interlayer connection wiring 12 is formed of a transparent member.

The wiring 13 is a wiring disposed above the wiring 11. The wiring 13 is connected to the interlayer connection wiring 12 around the through hole 19. The wiring 13 is formed of a transparent member.

The embedded part 16 is embedded in a recess 15 of the interlayer connection wiring 12 formed according to the through hole 19. The embedded part 16 is formed of a transparent member. The wiring 13 in the drawing is formed into a shape adjacent to a surface of the embedded part 16.

As described above, the interlayer connection wiring 12 and the wiring 13 may be formed of a transparent conductor. Specifically, the interlayer connection wiring 12 and the wiring 13 may be formed of a member containing any of indium-tin oxide (ITO), indium-zinc oxide (IZO), tin oxide (SnO$_x$), zinc oxide (ZnO$_x$), and titanium oxide (TiO$_x$).

The insulating layer 14 is also formed of a transparent member. Specifically, the insulating layer 14 may be formed of a member containing any of silicon oxide (SiO$_2$), silicon nitride (SiN), silicon oxynitride (SiON), silicon oxycarbide (SiOC), and fluorine-doped silicon oxide (SiOF). The insulating layer 14 may also be formed of a member containing any of carbon-doped silicon oxide (SiOCH), niobium oxide (Nb$_2$O$_5$), hafnium oxide (HfO$_2$), boron silicate glass (BSG), and boron phosphorus silicate glass (BPSG).

The wiring 11 in the drawing may be formed of a member similar to the interlayer connection wiring 12 and the wiring 13. The embedded part 16 in the drawing may be formed of a member similar to the insulating layer 14.

The wiring 11 is an example of a lower layer wiring described in the claims. The wiring 13 is an example of an upper layer wiring described in the claims.

The through hole 19 may have a tapered section as illustrated in the drawing. This can reduce a reduction in the film thickness of the interlayer connection wiring 12 on a wall surface of the through hole 19 and prevent the wiring resistance of the interlayer connection wiring 12 from increasing. The angle of the taper is preferably 50 degrees or more. This is because the size of the through hole 19 can decrease.

Figure 1B:
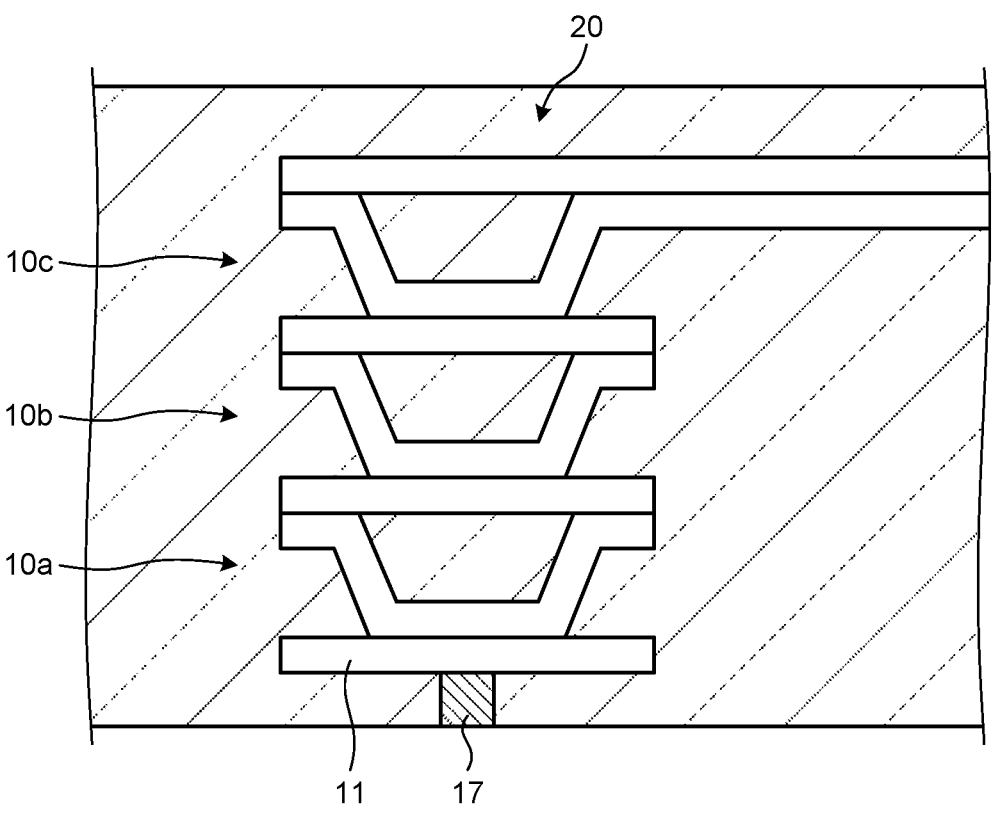
FIG. 1B is a sectional view illustrating another configuration example of the wiring part according to the first embodiment of the present disclosure.

FIG. 1B is a sectional view illustrating another configuration example of the wiring part according to the first embodiment of the present disclosure. The drawing is a diagram illustrating a configuration example of a wiring part 20 configured as a multilayer wiring. A multilayer wiring of two or more layers may be configured by stacking a plurality of wiring parts 10. The wiring part 20 in the drawing is illustrated as an example in which wiring parts 10a, 10b, and 10c are sequentially stacked to form a four-layer wiring. As illustrated in the drawing, a plurality of wiring parts 10 can be stacked at the same position because the surface of the wiring 13 in the wiring part 10 is planarized. Such a wiring part 20 falls into a so-called stacked via.

The drawing illustrates an example in which the wiring 11 is connected to a wiring (through electrode 17 described later) made of metal or the like. The through electrode 17 is a wiring made of tungsten (W), aluminum (Al), copper (Cu), or an alloy thereof. The through electrode 17 connects a transparent wiring (the wiring 11) and a metal wiring. The wiring part 20 having such a through electrode 17 may be applied to an imaging device 1 described later. The wiring 11 may be connected to a via plug made of metal. Alternatively, the wiring 12 may be connected to a lower metal wiring (not illustrated).

Method for Manufacturing Wiring Part

FIGS. 2A, 2B, 2C, 2D, 2E, 2F, 2G, 2H, 2I, 2J, 2K, 2L, and 2M are diagrams illustrating an example of a method for manufacturing the wiring part according to the first embodiment of the present disclosure. FIGS. 2A, 2B, 2C, 2D, 2E, 2F, 2G, 2H, 2I, 2J, 2K, 2L, and 2M are diagrams illustrating an example of a manufacturing process of the wiring part 10.

Figure 2A:
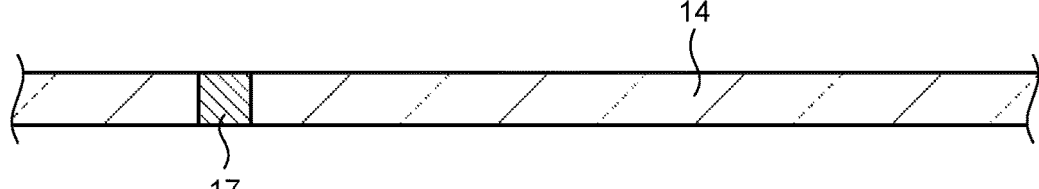
FIG. 2A is a diagram illustrating an example of a method for manufacturing the wiring part according to the first embodiment of the present disclosure.

First, form the through electrode 17 in the insulating layer 14 (FIG. 2A). This may be performed by embedding a member constituting the through electrode 17 in a hole formed in the insulating layer 14.

Figure 2B:
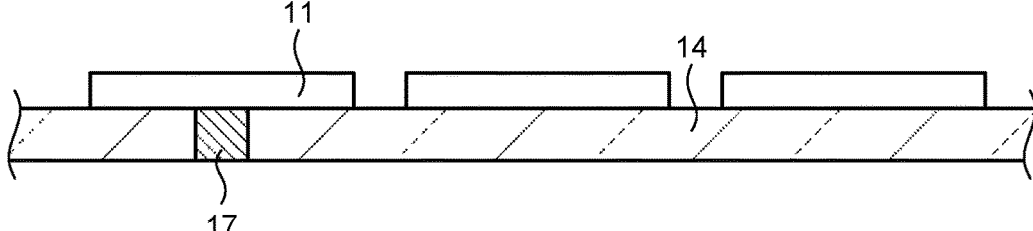
FIG. 2B is a diagram illustrating an example of the method for manufacturing the wiring part according to the first embodiment of the present disclosure.

Next, form the wiring 11 on the surface of the insulating layer 14 (FIG. 2B). This may be performed by disposing a material film of the wiring 11 on the surface of the insulating layer 14 and etching and removing unnecessary portions. The material film of the wiring 11 may be formed by forming a film of ITO or the like using physical vapor deposition (PVD), chemical vapor deposition (CVD), atomic layer deposition (ALD), or the like. The material film of the wiring 11 may also be formed by a spin coating method or an inkjet method. The etching of the material film of the wiring 11 may be performed by dry etching or wet etching. Material films of the interlayer connection wiring 12 and the wiring 13 described later may be formed in the same manner.

An intermediate layer may be disposed on the surface of the through electrode 17 before the material film of the wiring 11 is disposed. Disposing the intermediate layer can prevent oxidation of metal, such as W constituting the through electrode 17. Disposing the intermediate layer can also reduce the connection resistance between the through electrode 17 and the wiring 11. For the intermediate layer, a film made of titanium (Ti), titanium nitride (TiN), or titanium oxide (TiO$_x$) may be used, for example.

Figure 2C:
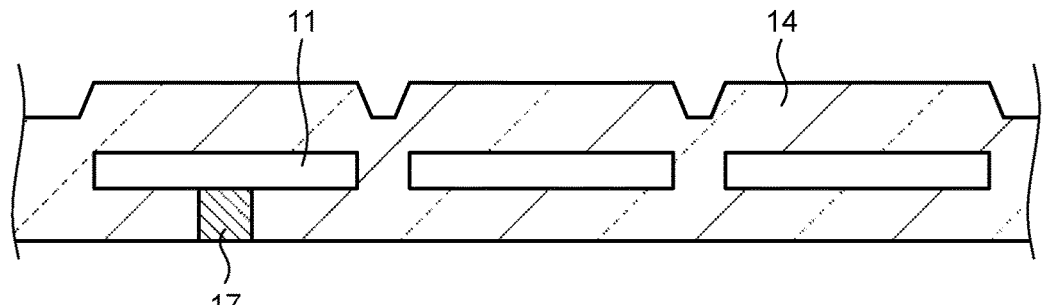
FIG. 2C is a diagram illustrating an example of the method for manufacturing the wiring part according to the first embodiment of the present disclosure.
Figure 2D:
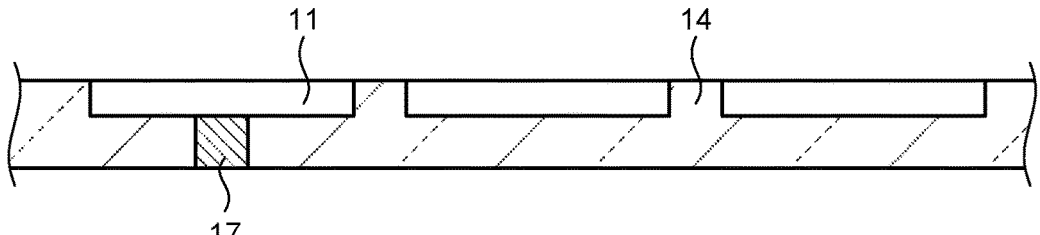
FIG. 2D is a diagram illustrating an example of the method for manufacturing the wiring part according to the first embodiment of the present disclosure.

Next, dispose the insulating layer 14 to cover the wiring 11 (FIG. 2C). This may be performed by, PVD, CVD, ALD, spin coating, or the like, for example. Next, grind the insulating layer 14 to expose the surface of the wiring 11 (FIG. 2D). The grinding of the insulating layer 14 may be performed by chemical mechanical polishing (CMP), for example. The space between the lines of the wiring 11 may be filled with the insulating layer 14 through this step.

Figure 2E:
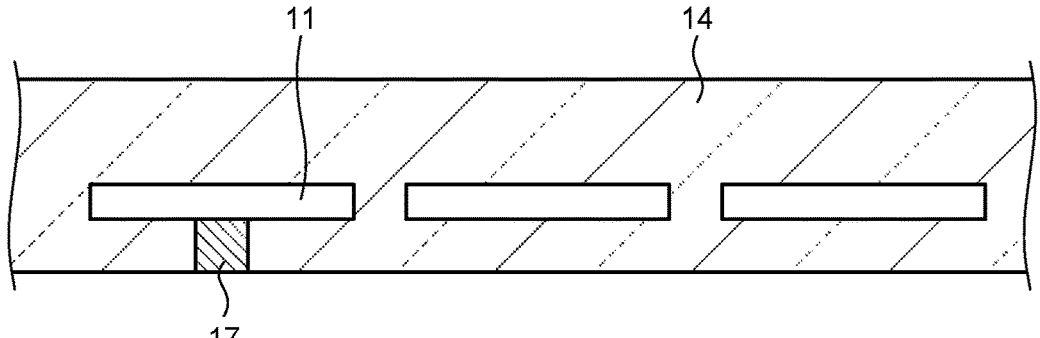
FIG. 2E is a diagram illustrating an example of the method for manufacturing the wiring part according to the first embodiment of the present disclosure.

Next, dispose again the film of the insulating layer 14 on the surface of the wiring 11 (FIG. 2E).

Figure 2F:
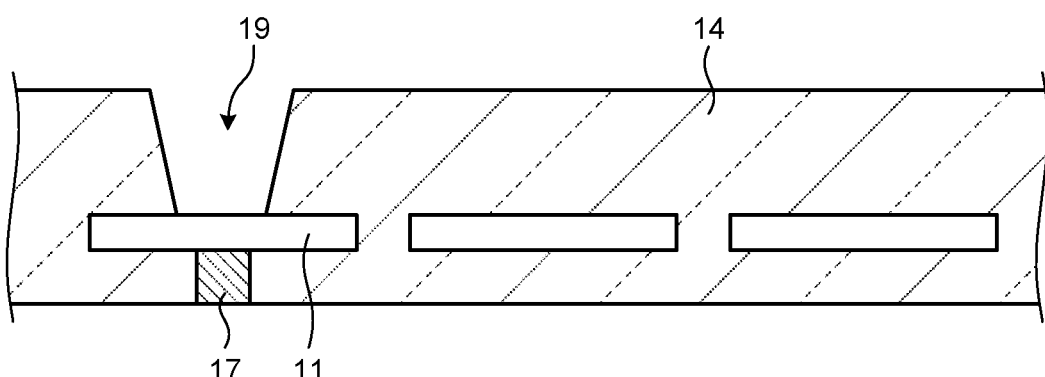
FIG. 2F is a diagram illustrating an example of the method for manufacturing the wiring part according to the first embodiment of the present disclosure.

Next, form the through hole 19 in a part adjacent to the wiring 11 (FIG. 2F). This may be performed by dry etching, for example. This step is an example of a step of forming a through hole described in the claims.

Figure 2G:
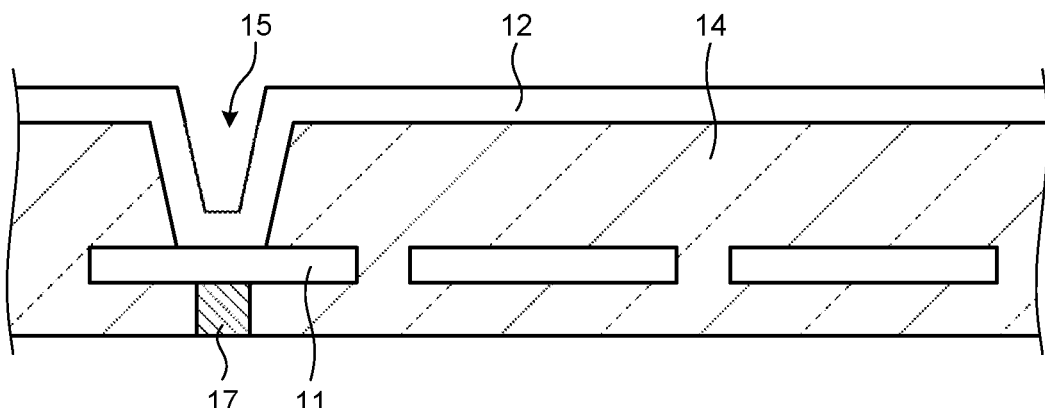
FIG. 2G is a diagram illustrating an example of the method for manufacturing the wiring part according to the first embodiment of the present disclosure.
Figure 2H:
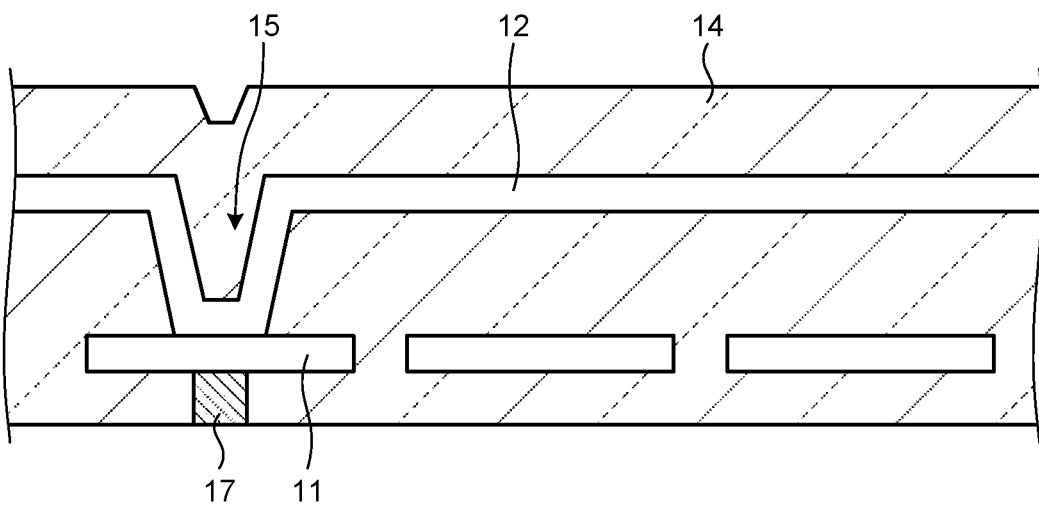
FIG. 2H is a diagram illustrating an example of the method for manufacturing the wiring part according to the first embodiment of the present disclosure.
Figure 2I:
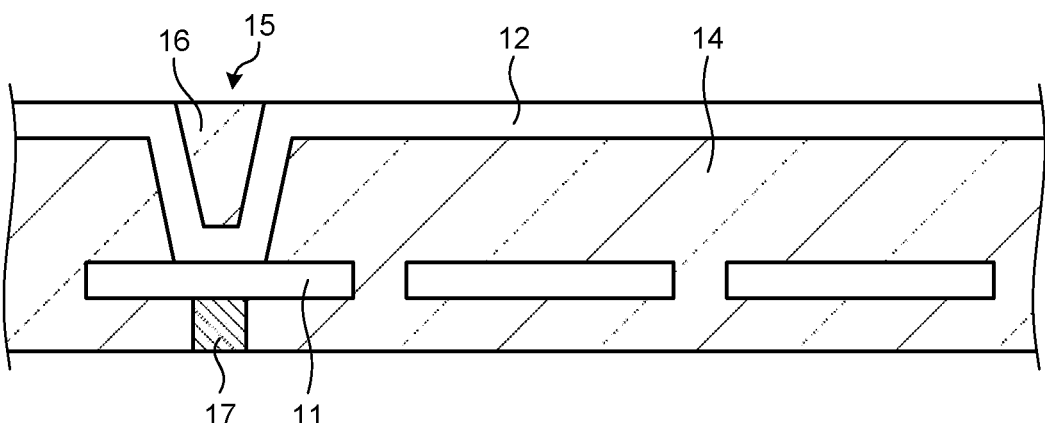
FIG. 2I is a diagram illustrating an example of the method for manufacturing the wiring part according to the first embodiment of the present disclosure.
Figure 2J:
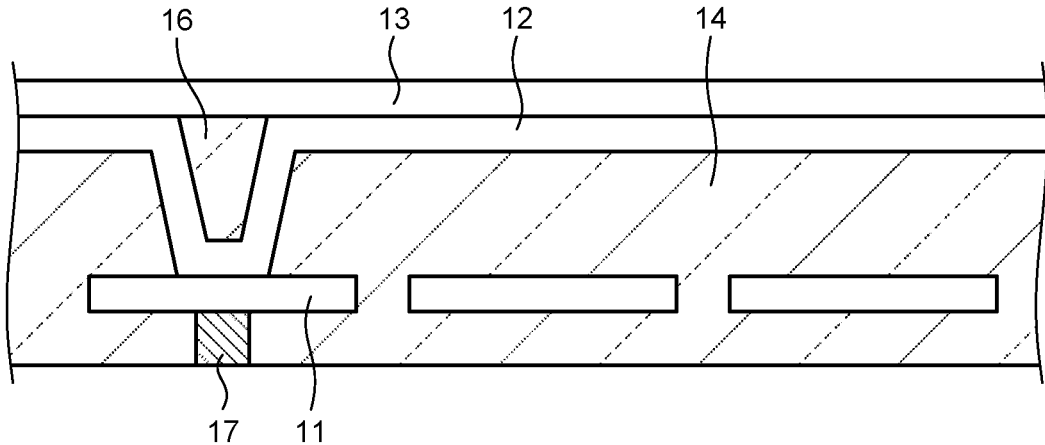
FIG. 2J is a diagram illustrating an example of the method for manufacturing the wiring part according to the first embodiment of the present disclosure.
Figure 2K:
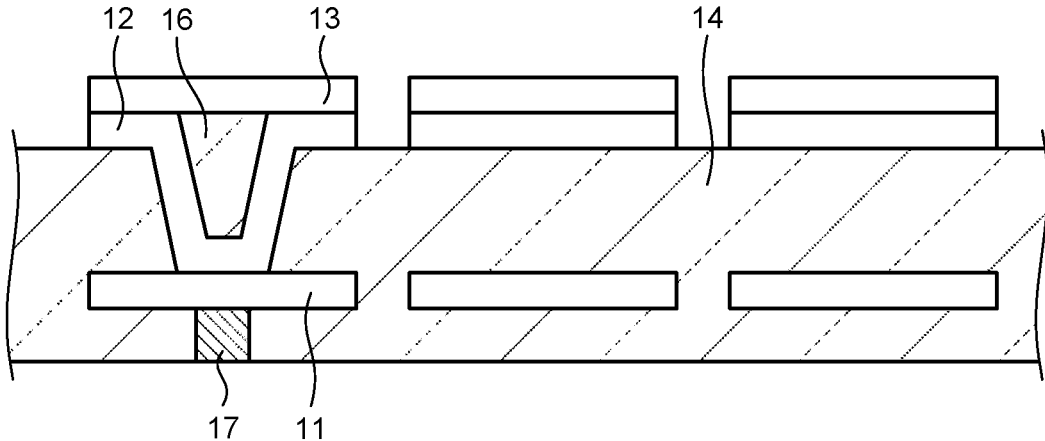
FIG. 2K is a diagram illustrating an example of the method for manufacturing the wiring part according to the first embodiment of the present disclosure.

Next, form a material film of the interlayer connection wiring 12 on the surface of the insulating layer 14 including the through hole 19 (FIG. 2G). In this material film, a recess 15 is formed in a part adjacent to the through hole 19. Next, dispose the insulating layer 14 on the surface of the material film of the interlayer connection wiring 12 including the recess 15 (FIG. 2H). Next, grind the insulating layer 14 other than the recess 15 (FIG. 2I). This may be performed by CMP, for example. The embedded part 16 may be thus disposed in the recess 15. Next, dispose the material film of the wiring 13 on the surfaces of the material film of the interlayer connection wiring 12 and the embedded part 16 (FIG. 2J). Next, perform etching on the material films of the interlayer connection wiring 12 and the wiring 13 to form the wiring 13 (FIG. 2K). This step is an example of a step of forming an interlayer connection wiring and a step of forming an upper layer wiring described in the claims.

Figure 2L:
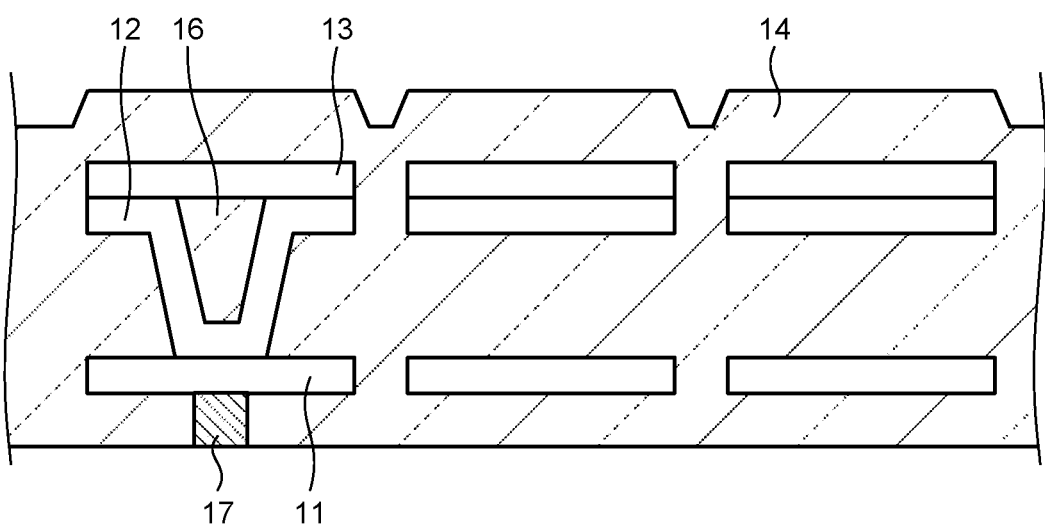
FIG. 2L is a diagram illustrating an example of the method for manufacturing the wiring part according to the first embodiment of the present disclosure.

Next, dispose a film of the insulating layer 14 on a side surface of the interlayer connection wiring 12 and the surface of the wiring 13 (FIG. 2L).

Figure 2M:
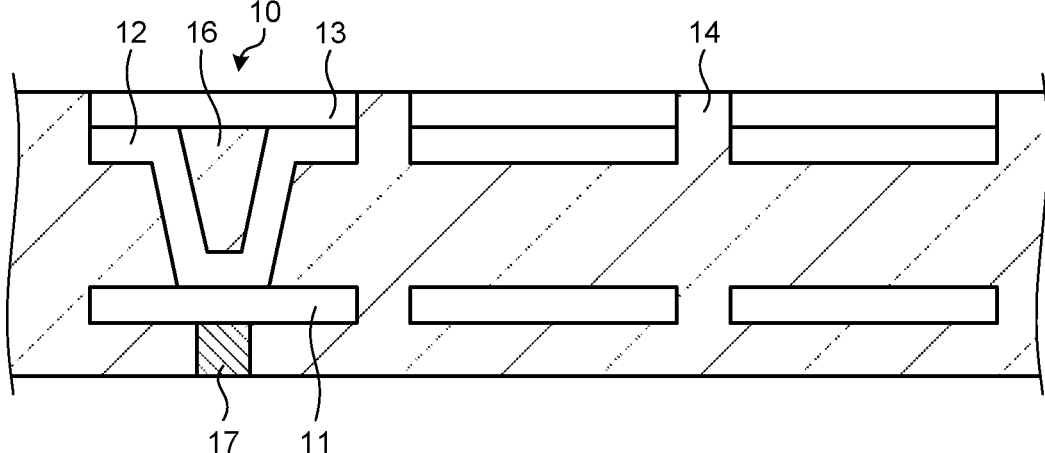
FIG. 2M is a diagram illustrating an example of the method for manufacturing the wiring part according to the first embodiment of the present disclosure.

Next, grind the insulating layer 14 to expose the wiring 13 (FIG. 2M). The wiring part 10 may be formed through these steps. The wiring part 20 may be formed by repeating the steps of FIGS. 2E, 2F, 2G, 2H, 2I, 2J, 2K, 2L, and 2M the desired number of times.

The step of FIG. 2E may be omitted by grinding the insulating layer 14 to a desired thickness in the step for the insulating layer 14 in the step of FIG. 2D. In such a case, it is necessary to perform grinding with high accuracy to make the film thickness of the insulating layer 14 constituting the interlayer insulating film uniform.

The surface on which the material film of the wiring 13 is to be disposed may be planarized by the step of FIG. 2I. This can reduce the occurrence of defects such as disconnection even when fine wiring is formed as the wiring 13.

Disposition of Wiring Part

Figure 3A:
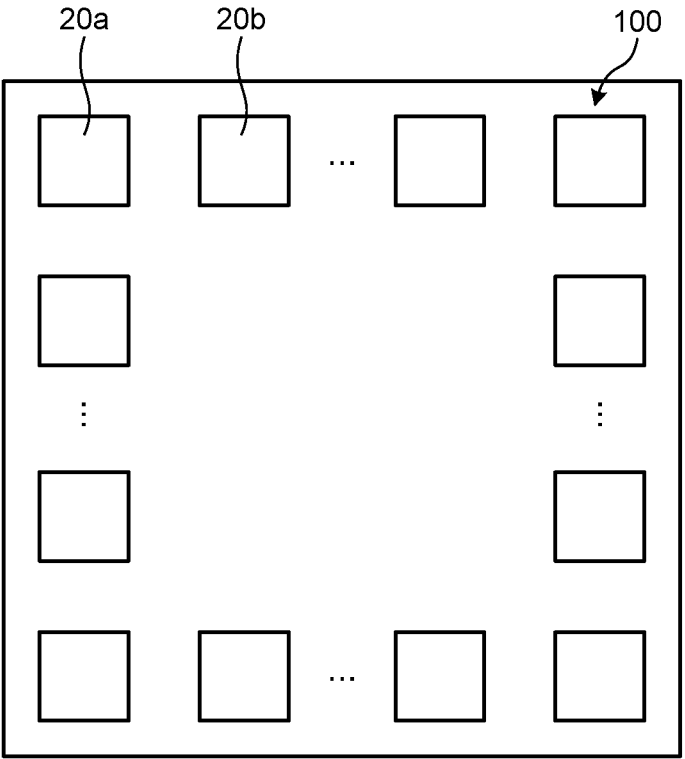
FIG. 3A is a plan view illustrating an example of a disposition of the wiring part according to the first embodiment of the present disclosure.
Figure 3B:
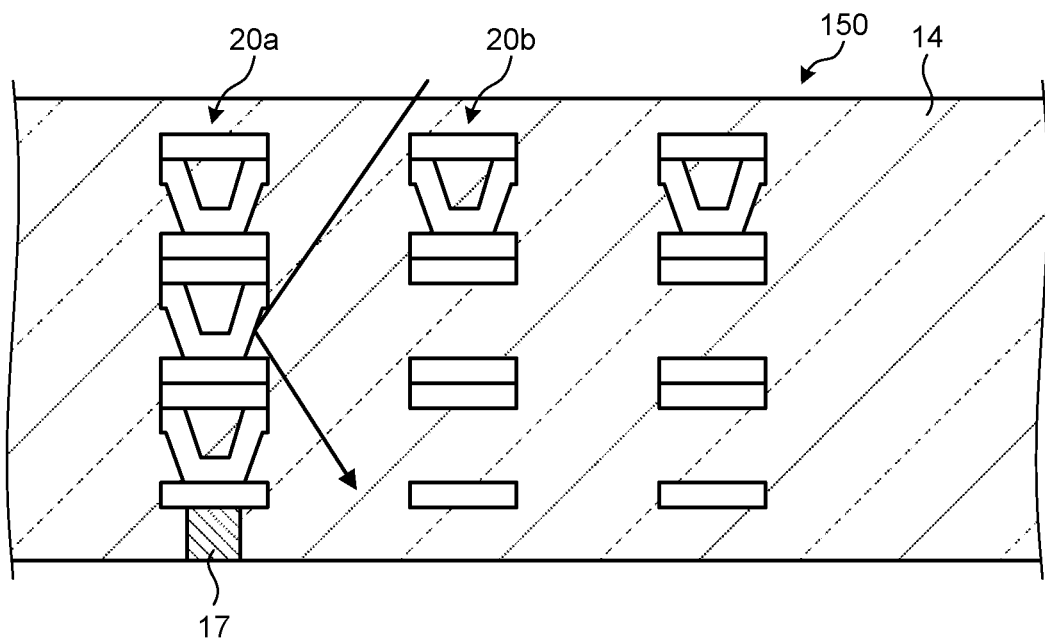
FIG. 3B is a sectional view illustrating an example of the disposition of the wiring part according to the first embodiment of the present disclosure.

FIG. 3A is a plan view illustrating an example of a disposition of the wiring part according to the first embodiment of the present disclosure. FIG. 3B is a sectional view illustrating an example of the disposition of the wiring part according to the first embodiment of the present disclosure. FIGS. 3A and 3B are diagrams illustrating an example in which the wiring part 20 is applied to wiring of a pixel 100 described later. The wiring part 20 is applied to a transparent wiring that transmits a signal of the pixel 100. A photoelectric conversion unit that performs photoelectric conversion of incident light is disposed in the pixel 100. In FIGS. 3A and 3B, wiring parts 20a and 20b are illustrated. The wiring part 20a may be disposed in a region other than a corner of the pixel 100.

As illustrated in FIG. 3B, the through electrode 17 is connected to the wiring part 20a. As described later, the wiring 13 at the upper most layer of the wiring part 20a is connected to an electrode of the photoelectric conversion unit and transmits a signal. On the other hand, the wiring part 20b is a wiring part that does not contribute to transmission of signals or the like. The wiring part 20b is a so-called dummy wiring.

Setting the refractive indexes of the wirings 11 and 13, the interlayer connection wiring 12, and the insulating layer 14 to have different values allows the side surfaces of the interlayer connection wiring 12 and the like to reflect incident light. Specifically, the refractive index of the interlayer connection wiring 12 and the like is made higher than that of the insulating layer 14. For example, ITO and $SiO_2$ are used as the interlayer connection wiring 12 and the insulating layer 14. Since the refractive indexes of ITO and $SiO_2$ are approximately 2.0 and 1.4, respectively, the interface between the interlayer connection wiring 12 and the insulating layer 14 can reflect incident light.

Arranging such wiring parts 20a and 20b in vicinity to the boundary of the pixel 100 allows incident light obliquely entering the pixel 100 to be reflected in the direction of the photoelectric conversion unit inside the pixel 100. The arrow in FIG. 3B indicates a state in which incident light is reflected. This configuration can improve the sensitivity of the pixel 100.

In this manner, in the electronic device according to the first embodiment of the present disclosure, the wiring 11 as the lower layer wiring and the wiring 13 as the upper layer wiring are connected by the interlayer connection wiring 12 in the wiring part 10. This configuration can form the wiring formed of the transparent conductive film into a multilayer wiring. This configuration can prevent a reduction of light in the wiring part connected to the optical device. In addition, disposing the embedded part 16 in the recess 15 of the interlayer connection wiring 12 can fill and planarize the recess on the lower layer surface of the wiring 13 formed based on the through hole 19. This can reduce the occurrence of defects such as disconnection of the wiring 13. In addition, the wiring part 10 can be stacked at the same place. As a result, it is possible to reduce the area where two or more layers of connection parts (wiring part 20) are disposed.

2. Second Embodiment

In the electronic device according to the above-described first embodiment, the embedded part 16 made of the same material as the material of the insulating layer 14 is used in the wiring part 10. An electronic device according to a second embodiment of the present disclosure is different from the above-described first embodiment in that an embedded part 16 made of a material different from that of the insulating layer 14 is used.

Configuration of Wiring Part

Figure 4:
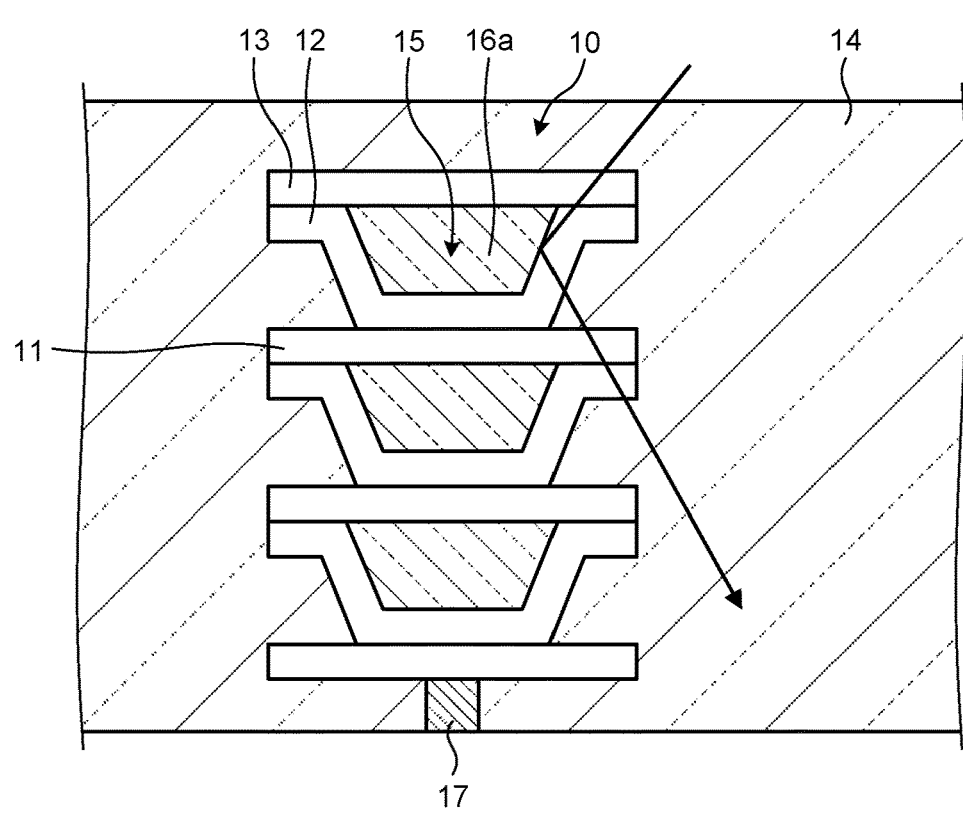
FIG. 4 is a sectional view illustrating a configuration example of a wiring part according to a second embodiment of the present disclosure.

FIG. 4 is a sectional view illustrating a configuration example of a wiring part according to the second embodiment of the present disclosure. The drawing is a sectional view illustrating a configuration example of the wiring part 10 similarly to FIGS. 1A and 1B. The wiring part 10 in the drawing is different from the wiring part 10 in FIGS. 1A and 1B in that an embedded part 16a is provided instead of the embedded part 16.

The embedded part 16a is a transparent insulator similar to the insulating layer 14. The embedded part 16a is preferably formed of a member having a refractive index higher than that of the insulating layer 14. This is because incident light can be further reflected on a side surface of the embedded part 16a or the like. The arrow in the drawing indicates a state in which incident light is reflected. For example, when ITO and $SiO_2$ are used as the interlayer connection wiring 12 and the insulating layer 14, the embedded part 16a is made of niobium oxide ($Nb_2O_5$) or hafnium oxide ($HfO_2$). Since the refractive indexes of $Nb_2O_5$ and $HfO_2$ are higher than those of the interlayer connection wiring 12 and the insulating layer 14, incident light can be reflected on a side surface of the embedded part 16a or the like. Applying such a wiring part 10 to the pixel 100 described above can further improve the sensitivity of the pixel 100.

Other configurations of the electronic device are the same as those of the electronic device according to the first embodiment of the present disclosure, and thus, description thereof will be omitted.

In this manner, in the electronic device according to the second embodiment of the present disclosure, it is possible to increase incident light reflected at the interface of the embedded part 16a by disposing the embedded part 16a having a refractive index higher than that of the insulating layer 14 in the wiring part 10. This configuration can improve the sensitivity of the optical device of the electronic device.

3. Third Embodiment

In the electronic device of the above-described first embodiment, the insulating layer 14 is disposed around the wiring part 10. An electric device according to a third embodiment of the present disclosure is different from the above-described first embodiment in that insulating layers formed of different members are stacked.

Configuration of Wiring Part

Figure 5:
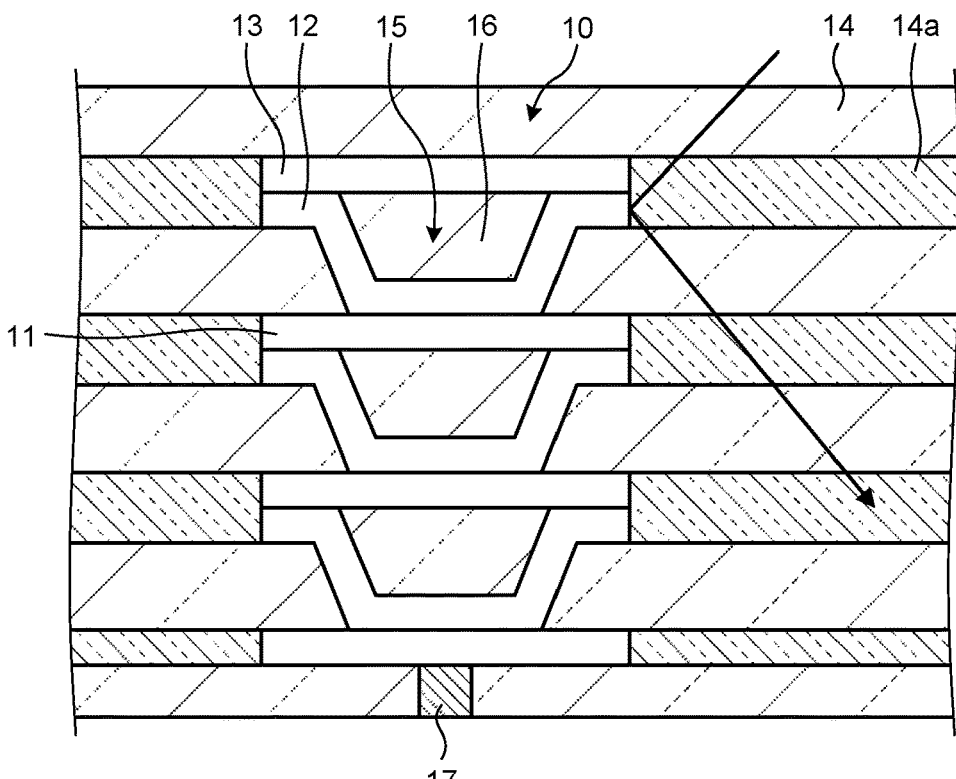
FIG. 5 is a sectional view illustrating a configuration example of a wiring part according to a third embodiment of the present disclosure.

FIG. 5 is a sectional view illustrating a configuration example of a wiring part according to the third embodiment of the present disclosure. The drawing is a sectional view illustrating a configuration example of the wiring part 10 similarly to FIGS. 1A and 1B. The wiring part 10 in the drawing is different from the wiring part 10 in FIGS. 1A and 1B in that it further includes an insulating layer 14a.

The insulating layer 14a is an insulating layer disposed on a side surface of the wiring 13 and a side surface of the interlayer connection wiring 12 in a region other than the recess 15. The insulating layer 14a may be formed of a member having a refractive index different from that of the insulating layer 14. The insulating layer 14a is preferably formed of a member having a refractive index higher than that of the insulating layer 14. This is because reflection of incident light on the side surface of the wiring 13 can increase. For example, when ITO and $SiO_2$ are used as the wiring 13 and the like and the insulating layer 14, the insulating layer 14a is made of silicon oxynitride (SiON) or silicon nitride (SiN). Since the refractive indexes of SiON and SiN are higher than that of the wiring 13 and the interlayer connection wiring 12, incident light can be reflected on the side surface of the wiring 13 and the like.

Applying such a wiring part 10 to the pixel 100 described above can further improve the sensitivity of the pixel 100. The insulating layer 14*a* is an example of a second insulating layer described in the claims.

Other configurations of the electronic device are the same as those of the electronic device according to the first embodiment of the present disclosure, and thus, description thereof will be omitted.

In this manner, the electronic device according to the third embodiment of the present disclosure can increase incident light reflected on the side surface of the wiring 13 and the like by using the insulating layers 14 and 14*a* having different refractive indexes. This configuration can improve the sensitivity of the optical device of the electronic device.

4. Fourth Embodiment

The electronic device according to the above-described first embodiment uses the wirings 11 and 13 of single layer. An electronic device according to a fourth embodiment of the present disclosure is different from the above-described first embodiment in that a film that protects the wirings 11 and 13 is stacked on the wirings 11 and 13.

Configuration of Wiring Part

Figure 6:
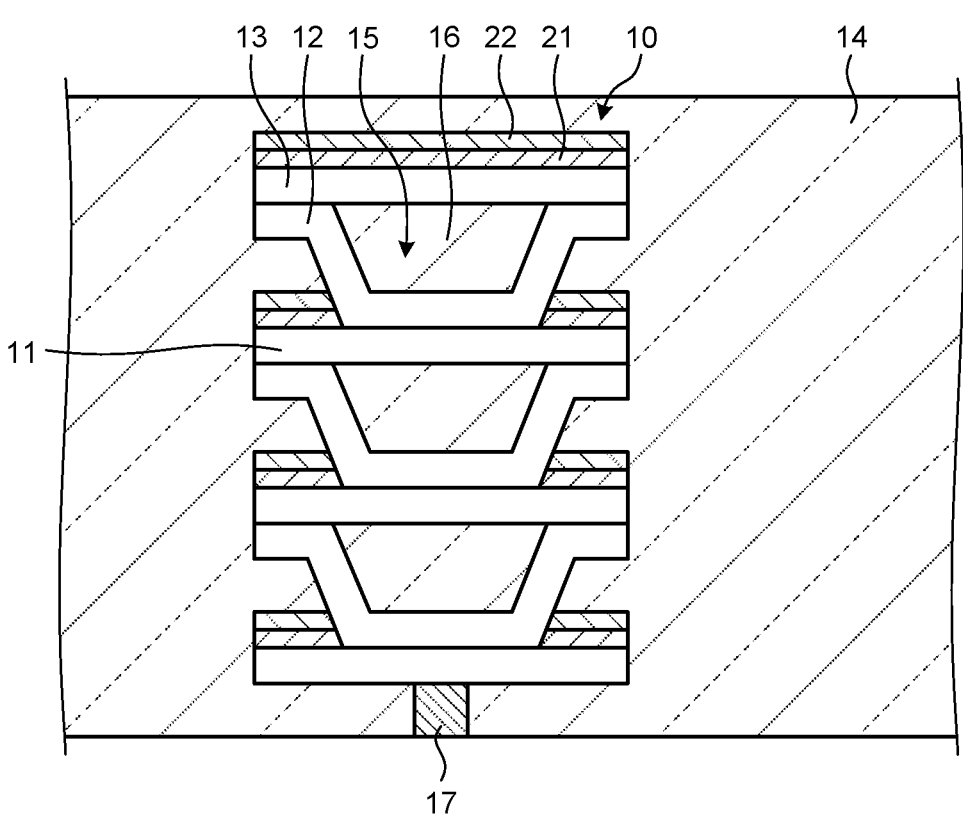
FIG. 6 is a sectional view illustrating a configuration example of a wiring part according to a fourth embodiment of the present disclosure.

FIG. 6 is a sectional view illustrating a configuration example of a wiring part according to the fourth embodiment of the present disclosure. The drawing is a sectional view illustrating a configuration example of the wiring part 10 similarly to FIGS. 1A and 1B. The wiring part 10 in the drawing is different from the wiring part 10 in FIGS. 1A and 1B in that it further includes protective films 21 and 22.

The protective film 22 is a film that protects the wirings 11 and 13. The protective film 22 protects the wirings 11 and 13 when the insulating layer 14 is planarized in the manufacturing process of the wiring part 10. As described in FIGS. 2D and 2I, when the wiring part 10 is manufactured, the insulating layer 14 is ground through CMP or the like. The protective film 22 protects the wirings 11 and 13 from CMP in this grinding. As the protective film 22, a member having an etching rate lower than that of a member constituting the insulating layer 14 such as SiN may be used, for example. Disposing the protective film 22 can stop (suppress) grinding through CMP or the like at the part of the protective film 22. Excessive grinding can be prevented, and the wirings 11 and 13 can be protected. Such a protective film 22 is referred to as an etching stopper. Disposing such an etching stopper eliminates the need of controlling a grinding (etching) amount of CMP and can simplify the grinding step.

The protective film 21 protects the wirings 11 and 13 similarly to the protective film 22. The protective film 21 is disposed between the protective film 22 and the wirings 11 and 13, and it protects the wirings 11 and 13 when the protective film 22 is formed. SiN constituting the protective film 22 may be formed through CVD or the like. In this step, there is a concern that ITO constituting the wirings 11 and 13 is reduced. Then, the transparency of the wirings 11 and 13 lowers. Disposing the protective film 21 can prevent the reduction of ITO in the wirings 11 and 13. SiO$_2$ may be used for the protective film 21, for example.

The protective films 22 and 21 may also be used as antireflection films for incident light.

Method for Manufacturing Wiring Part

Figure 7A:
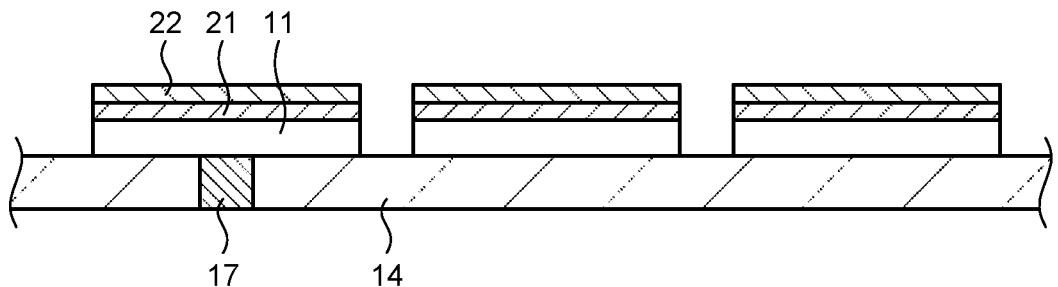
FIG. 7A is a diagram illustrating an example of a method for manufacturing the wiring part according to the fourth embodiment of the present disclosure.
Figure 7B:
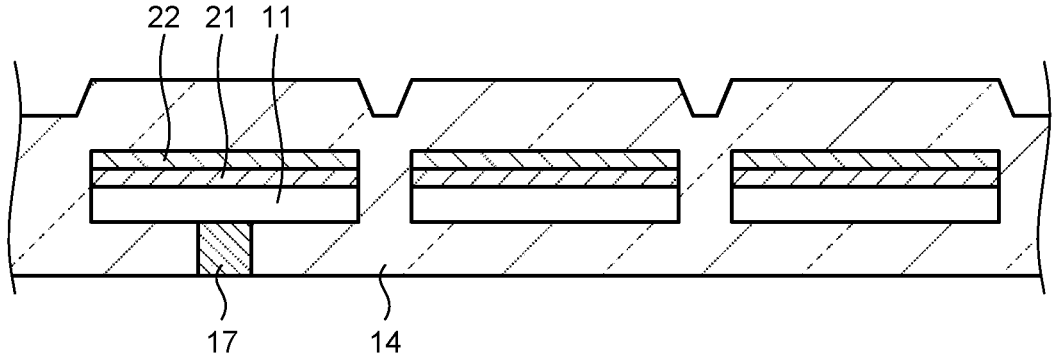
FIG. 7B is a diagram illustrating an example of the method for manufacturing the wiring part according to the fourth embodiment of the present disclosure.
Figure 7C:
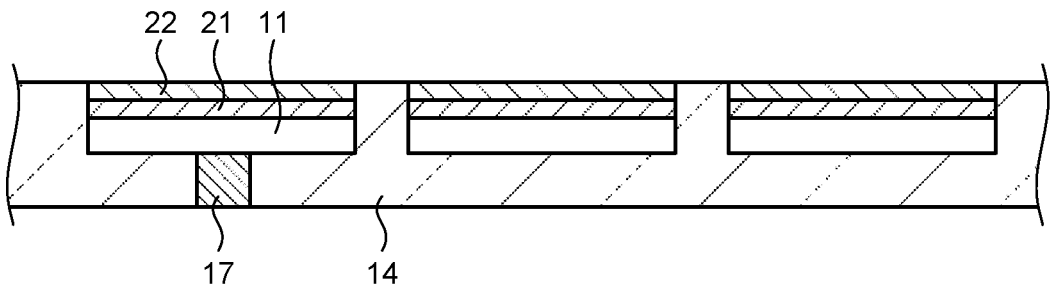
FIG. 7C is a diagram illustrating an example of the method for manufacturing the wiring part according to the fourth embodiment of the present disclosure.

FIGS. 7A, 7B, and 7C are diagrams illustrating an example of a method for manufacturing the wiring part according to the fourth embodiment of the present disclosure. FIGS. 7A, 7B, and 7C are diagrams illustrating an example of the manufacturing process of the wiring part 10, which are performed instead of FIGS. 2B, 2C, and 2D, respectively.

Sequentially stack respective material films of the wiring 11, the protective film 21, and the protective film 22 on the insulating layer 14 in which the through electrode 17 is embedded, and perform etching on unnecessary portions to form the wiring 11, the protective film 21, and the protective film 22 (FIG. 7A).

Next, dispose the insulating layer 14 to cover the wiring 11 on which the protective films 21 and 22 are stacked (FIG. 7B), and grind unnecessary insulating layer 14 (FIG. 7C). This grinding stops in the vicinity of the surface of the protective film 22. As a result, the region of the lower layer wiring 11 is protected.

Also in the steps of FIGS. 2L and 2M, stack the protective film 21 and the protective film 22 on the wiring 13 as in FIG. 7A. This can protect the wiring 13 in the process of FIG. 2M.

Other configurations of the electronic device are the same as those of the electronic device according to the first embodiment of the present disclosure, and thus, description thereof will be omitted.

In this manner, in the electronic device according to the fifth embodiment of the present disclosure, the wirings 11 and 13 can be protected by disposing the protective films 21 and 22 on the surface of the wirings 11 and 13. In addition, the process of grinding the insulating layer 14 can be simplified by using the protective film 22 as an etching stopper.

5. Fifth Embodiment

In the electronic device according to the above-described first embodiment, the embedded part 16 formed of an insulator is disposed in the recess 15. An electronic device according to a fifth embodiment of the present disclosure is different from the above-described first embodiment in that a member constituting the interlayer connection wiring 12 is disposed.

Configuration of Wiring Part

Figure 8:
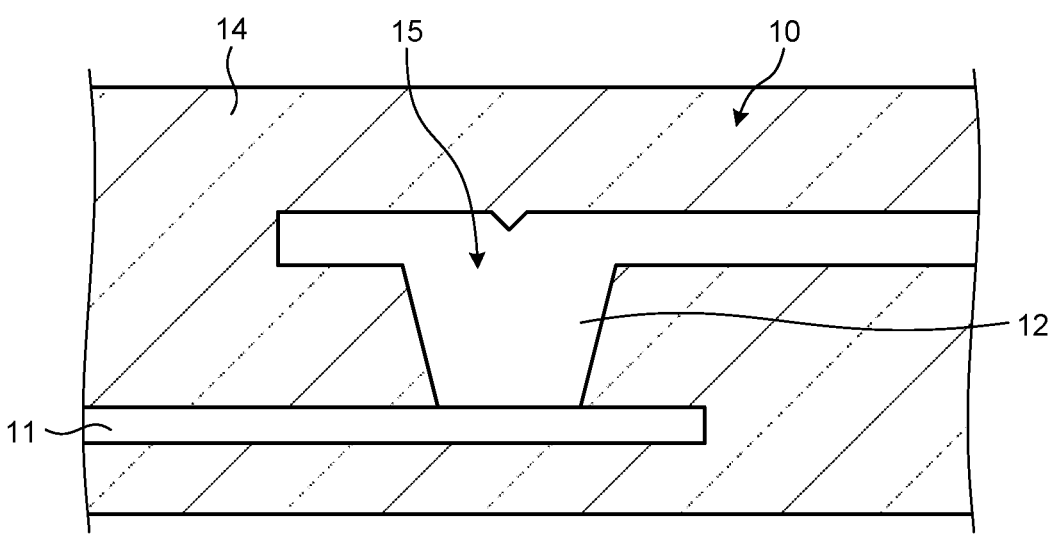
FIG. 8 is a sectional view illustrating a configuration example of a wiring part according to a fifth embodiment of the present disclosure.

FIG. 8 is a sectional view illustrating a configuration example of a wiring part according to the fifth embodiment of the present disclosure. The drawing is a sectional view illustrating a configuration example of the wiring part 10 similarly to FIGS. 1A and 1B. The wiring part 10 in the drawing is different from the wiring part 10 in FIGS. 1A and 1B in that the interlayer connection wiring 12 is embedded in the recess 15.

The embedded part in the drawing is formed of the interlayer connection wiring 12 formed into a thick film. Filling the recess 15 using the material film of the interlayer connection wiring 12 as illustrated in the drawing can eliminate the step of disposing the embedded part 16. It is possible to simplify the manufacturing process of the wiring part 10. The interlayer connection wiring 12 with an unevenness in the region of the recess 15 does not cause any problem as long as the unevenness does not affect stacking of the wiring part 10 of the upper layer.

Other configurations of the electronic device are the same as those of the electronic device according to the first embodiment of the present disclosure, and thus, description thereof will be omitted.

In this manner, in the electronic device according to the fifth embodiment of the present disclosure, the manufacturing process of the wiring part 10 can be simplified by filling the recess 15 using the material film of the interlayer connection wiring 12.

6. Sixth Embodiment

In the electronic device according to the above-described fifth embodiment, the member constituting the interlayer connection wiring 12 is disposed in the recess 15. An electronic device according to a sixth embodiment of the present disclosure is different from the above-described fifth embodiment in that a member constituting the wiring 13 is disposed.

Configuration of Wiring Part

Figure 9:
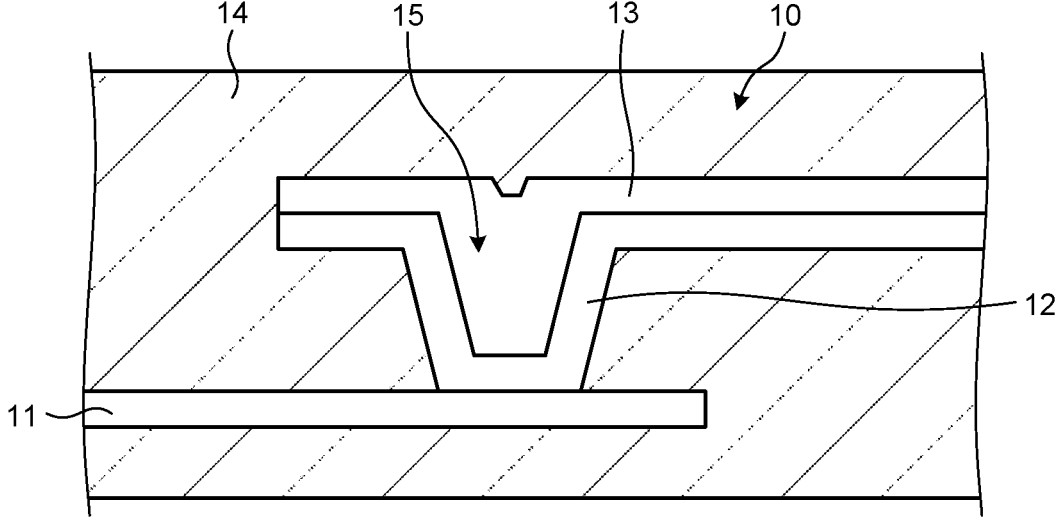
FIG. 9 is a sectional view illustrating a configuration example of a wiring part according to a sixth embodiment of the present disclosure.

FIG. 9 is a sectional view illustrating a configuration example of a wiring part according to the sixth embodiment of the present disclosure. The drawing is a sectional view illustrating a configuration example of the wiring part 10 similarly to FIG. 8. The wiring part 10 in the drawing is different from the wiring part 10 in FIG. 8 in that the wiring 13 is embedded in the recess 15.

The embedded part in the drawing is formed of the wiring 13 formed into a thick film. Arranging a plurality of transparent conductive films in the recess 15 as illustrated in the drawing can make the recess 15 shallow and reduce the unevenness of the wiring 13 in the region of the recess 15. In addition, since the step of disposing the embedded part 16 can be omitted, the manufacturing process of the wiring part 10 can be simplified.

Other configurations of the electronic device are the same as those of the electronic device according to the fifth embodiment of the present disclosure, and thus, description thereof is omitted.

In this manner, in the electronic device according to the sixth embodiment of the present disclosure, the manufacturing process of the wiring part 10 can be simplified by filling the recess 15 using the material films of the interlayer connection wiring 12 and the wiring 13.

7. Seventh Embodiment

In the electronic device according to the above-described first embodiment, the upper surface of the through electrode 17 is in contact with the wiring 11 of the wiring part 10. An electronic device according to a seventh embodiment of the present disclosure is different from the above-described first embodiment in that the through electrode 17 is formed into a shape embedded in the wiring 11.

Configuration of Wiring Part

Figure 10:
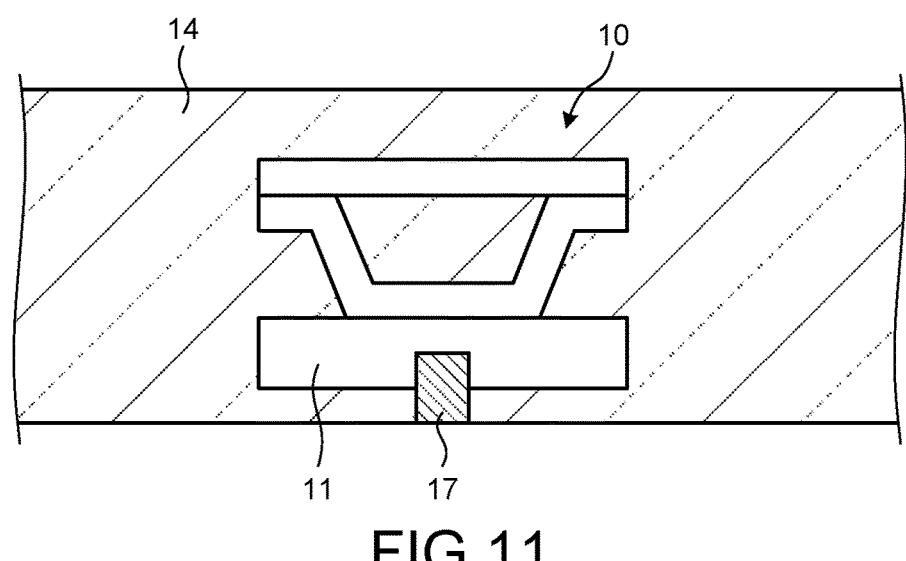
FIG. 10 is a sectional view illustrating a configuration example of a wiring part according to a seventh embodiment of the present disclosure.

FIG. 10 is a sectional view illustrating a configuration example of a wiring part according to the seventh embodiment of the present disclosure. The drawing is a sectional view illustrating a configuration example of the wiring part 10 similarly to FIG. 1A. The wiring part 10 in the drawing is different from the wiring part 10 in FIG. 1A in that the through electrode 17 is formed into a shape embedded in the wiring 11.

The through electrode 17 in the drawing is formed into a shape protruding from the surface of the insulating layer 14 before the wiring 11 is formed. Forming the wiring 11 on the surface of the insulating layer 14 including the through electrode 17 having the protruding shape can form the through electrode 17 into a shape embedded in the wiring 11. The through electrode 17 having a shape protruding from the surface of the insulating layer 14 may be formed, for example, by selectively etching the insulating layer 14 in the step of FIG. 2A. Through this etching, the surface of the insulating layer 14 is ground by 10 to 100 nm to form the through electrode 17 having a protruding shape.

Since the through electrode 17 is formed into a shape embedded in the wiring 11, the contact area between the through electrode 17 and the wiring 11 increases, and the connection resistance can decrease. In addition, the concentration of the electric field at a corner of the through electrode 17 that is protruding can cause a tunnel effect. Even when an oxide film is formed on the surface of the through electrode 17, the connection resistance can decrease.

Other configurations of the electronic device are the same as those of the electronic device according to the first embodiment of the present disclosure, and thus, description thereof will be omitted.

In this manner, in the electronic device according to the seventh embodiment of the present disclosure, the through electrode 17 is formed into a shape embedded in the wiring 11, and the connection resistance between the through electrode 17 and the wiring 11 can decrease.

8. Application Example to Imaging Device

The technology according to the present disclosure (present technology) may be applied to various products. For example, the technology according to the present disclosure may be realized as an imaging device.

Configuration of Imaging Device

Figure 11:
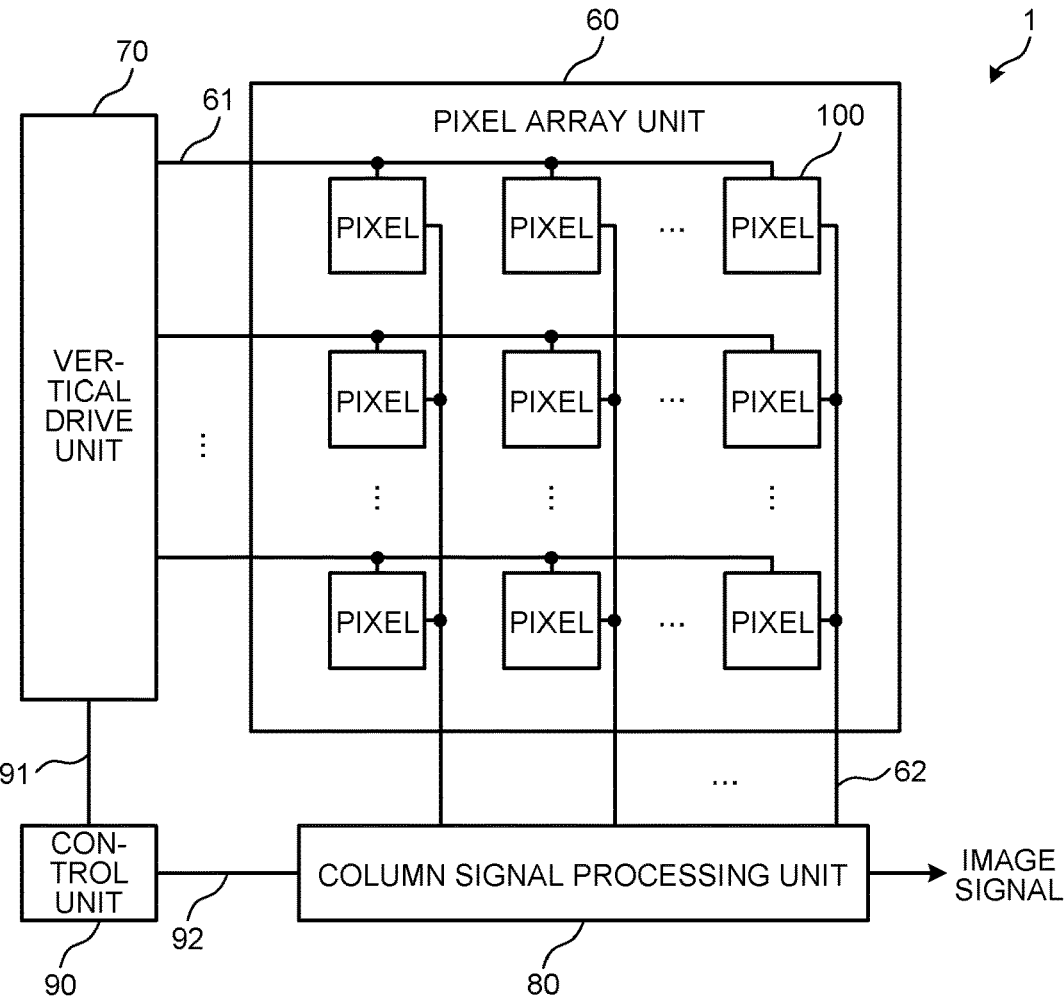
FIG. 11 is a diagram illustrating a configuration example of an imaging device to which the technology according to the present disclosure (present technology) may be applied.

FIG. 11 is a diagram illustrating a configuration example of an imaging device to which the technology according to the present disclosure (present technology) may be applied. The drawing is a block diagram illustrating a configuration example of an imaging device 1. A semiconductor device according to an embodiment of the present disclosure will be described by taking the imaging device 1 as an example. The imaging device 1 is a semiconductor device that generates image data of a subject. The imaging device 1 includes a pixel array unit 60, a vertical drive unit 70, a column signal processing unit 80, and a control unit 90.

The pixel array unit 60 is configured by arranging a plurality of pixels 100. The pixel array unit 60 in the drawing is illustrated as an example in which a plurality of pixels 100 is arranged in a shape of a two-dimensional matrix. Here, the pixel 100 includes a photoelectric conversion unit that performs photoelectric conversion of incident light, and it generates an image signal of a subject based on the emitted incident light. A photodiode may be used as the photoelectric conversion unit, for example. Signal lines 61 and 62 are wired to each pixel 100. The pixel 100 is controlled by a control signal transmitted by the signal line 61 to generate an image signal and outputs the generated image signal via the signal line 62. The signal line 61 is disposed for each row of the shape of the two-dimensional matrix and is shared by the plurality of pixels 100 arranged in one row. The signal line 62 is disposed for each column of the shape of the two-dimensional matrix and is shared by the plurality of pixels 100 arranged in one column.

The vertical drive unit 70 generates a control signal of the pixel 100 described above. The vertical drive unit 70 in the drawing generates a control signal for each row of the two-dimensional matrix of the pixel array unit 60 and sequentially outputs the control signal via a signal line 61.

The column signal processing unit 80 processes the image signal generated by the pixel 100. The column signal processing unit 80 in the drawing simultaneously processes image signals from the plurality of pixels 100 arranged in one row of the pixel array unit 60 transmitted via the signal line 62. As this processing, for example, analog-digital conversion for converting an analog image signal generated by the pixel 100 into a digital image signal and correlated double sampling (CDS) for removing an offset error of the image signal may be performed. The processed image signal is output to a circuit or the like outside the imaging device 1.

The control unit 90 controls the vertical drive unit and the column signal processing unit 80. The control unit 90 in the drawing outputs control signals via signal lines 91 and 92 to control the vertical drive unit 70 and the column signal processing unit 80, respectively. The imaging device 1 in the drawing is an example of an electronic device described in the claims.

Configuration of Pixel

Figure 12:
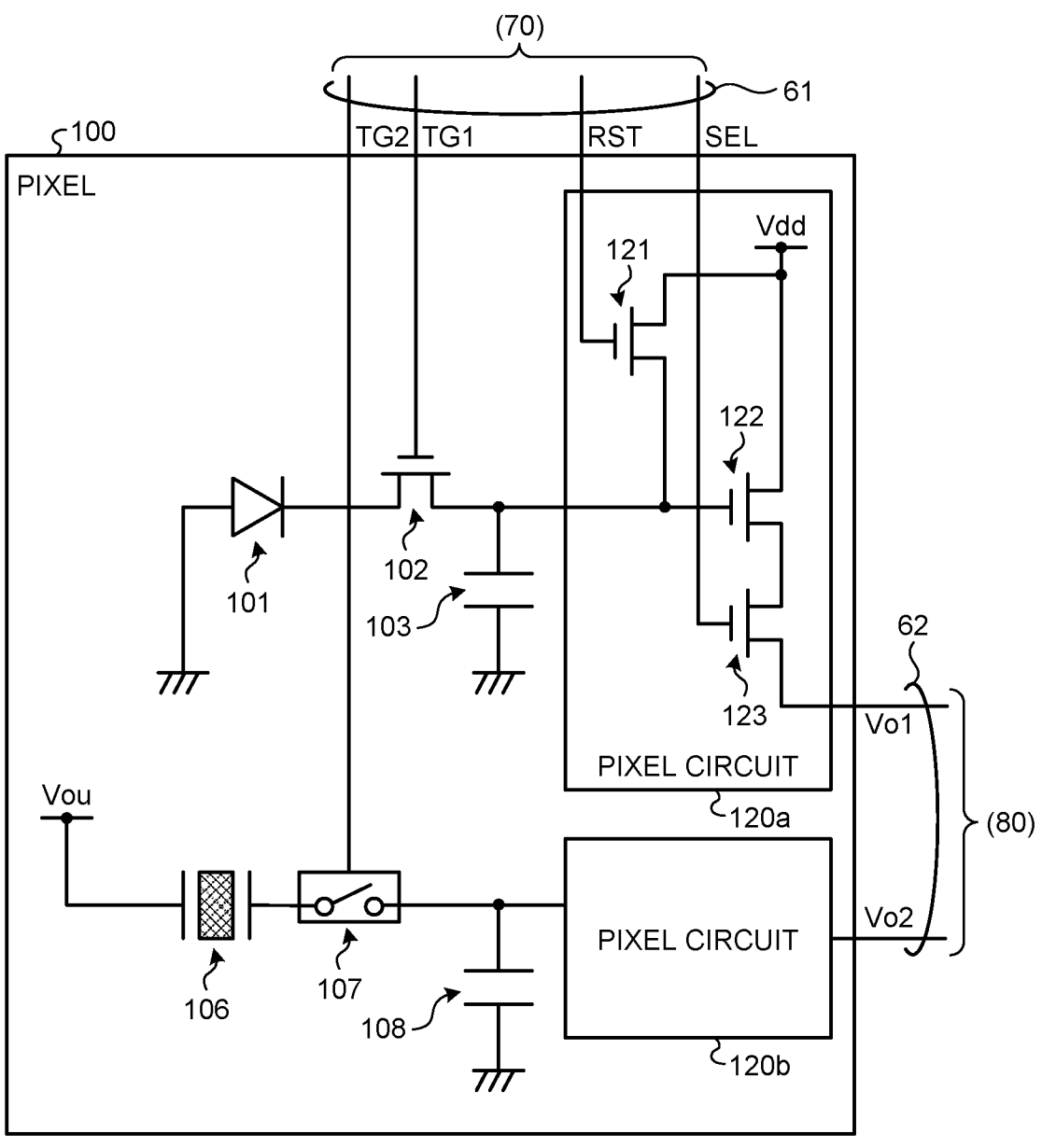
FIG. 12 is a diagram illustrating a configuration example of a pixel of the imaging device to which the technology according to the present disclosure (present technology) may be applied.

FIG. 12 is a diagram illustrating a configuration example of a pixel of the imaging device to which the technology according to the present disclosure (present technology) may be applied. The drawing is a circuit diagram illustrating a configuration example of the pixel 100. The pixel 100 in the drawing includes photoelectric conversion units 101 and 106, a charge transfer unit 102, a switching device 107, charge holding units 103 and 108, and pixel circuits 120a and 120b.

The pixel circuit 120a includes MOS transistors 121 to 123. The MOS transistors 121 to 123 and the charge transfer unit 102 may be formed of n-channel MOS transistors, for example.

As described above, the signal lines 61 and 62 are wired to the pixel 100. The signal line 61 in the drawing includes a signal line TG1, a signal line TG2, a signal line RST, and a signal line SEL. The signal line 62 includes a signal line Vo1 and a signal line Vo2. In addition, power supply lines Vdd and Vou are wired to the pixel 100. The power supply line Vdd is a wiring that supplies power to the pixel 100. The power supply line Vou is a wiring that supplies a bias voltage of the photoelectric conversion unit 106.

The anode of the photoelectric conversion unit 101 is grounded, and the cathode is connected to the source of the charge transfer unit 102. The drain of the charge transfer unit 102 is connected to the source of the MOS transistor 121, the gate of the MOS transistor 122, and one end of the charge holding unit 103. The other end of the charge holding unit 103 is grounded. The drain of the MOS transistor 121 and the drain of the MOS transistor 122 are both connected to the power supply line Vdd. The source of the MOS transistor 122 is connected to the drain of the MOS transistor 123, and the source of the MOS transistor 123 is connected to the signal line Vo1. The signal line TG1, the signal line RST, and the signal line SEL are connected to gates of the charge transfer unit 102, the MOS transistor 121, and the MOS transistor 123, respectively.

One end of the photoelectric conversion unit 106 is connected to the power supply line Vou, and the other end is connected to the input terminal of the switching device 107. The output terminal of the switching device 107 is connected to one end of the charge holding unit 108 and a pixel circuit 120b. The other end of the charge holding unit 108 is grounded. The signal line TG2 is connected to the control signal terminal of the switching device 107. The configuration of the pixel circuit 120b is the same as the configuration of the pixel circuit 120a, and thus, description thereof is omitted.

The photoelectric conversion unit 101 performs photoelectric conversion of incident light. The photoelectric conversion unit 101 may be formed of a photodiode formed on a semiconductor substrate 130 described later. The photoelectric conversion unit 101 in the drawing performs photoelectric conversion of infrared light of incident light.

The charge holding unit 103 and the charge holding unit 108 hold charges. The charge holding unit 103 and the charge holding unit 108 hold charges generated by the photoelectric conversion units 101 and 106, respectively. The charge holding units 103 and 108 may be formed of a floating diffusion (FD) which is a semiconductor region formed in the semiconductor substrate 130.

The charge transfer unit 102 transfers the charges generated through photoelectric conversion of the photoelectric conversion unit 101 to the charge holding unit 103. The charge transfer unit 102 transfers charges by forming electrically connecting the photoelectric conversion unit 101 and the charge holding unit 103. A control signal of the charge transfer unit 102 is transmitted by the signal line TG1.

A pixel circuit 120 generates an image signal based on the charges held in the charge holding units. The pixel circuits 120a and 120b generate image signals based on the charges held in the charge holding units 103 and 108, respectively, and output the image signals to the signal lines Vo1 and Vo2, respectively. As described above with the pixel circuit 120a as an example, the pixel circuit 120a includes the MOS transistors 121 to 123. The MOS transistor 121 resets the charge holding unit 103. This reset may be performed by discharging the charges in the charge holding unit by electrically connecting the charge holding unit 103 and the power supply line Vdd. A control signal of the MOS transistor 121 is transmitted by the signal line RST. The gate of the MOS transistor 122 is connected to the charge holding unit 103. Thus, an image signal having a voltage corresponding to the charges held in the charge holding unit 103 is generated at the source of the MOS transistor 122. Further, making the MOS transistor 123 conductive enables this image signal to be output to the signal line Vo1. A control signal of the MOS transistor 123 is transmitted by the signal line SEL. The photoelectric conversion unit 106 performs photoelectric conversion of incident light. As described later, the photoelectric conversion unit 106 is a photoelectric conversion device configured by sandwiching a photoelectric conversion film between a first electrode and a second electrode. The photoelectric conversion unit 106 is configured as a two-terminal device and generates charges based on photoelectric conversion. The photoelectric conversion unit 106 in the drawing photoelectrically converts visible light of incident light.

The switching device 107 is a device that transfers the charges generated by the photoelectric conversion unit 106 similar to the charge transfer unit 102. The switching device 107 is configured as a three-terminal device and includes an input terminal, an output terminal, and a control signal terminal. The switching device 107 becomes conductive when a control signal is input to the control signal terminal and transmits the charges generated by the photoelectric conversion unit 106 to the charge holding unit 108.

As described later, the photoelectric conversion unit 106 and the switching device 107 are integrally configured in the pixel 100. In the drawing, the photoelectric conversion unit 106 and the switching device 107 are illustrated as different devices for convenience.

Section Configuration of Pixel

Figure 13:
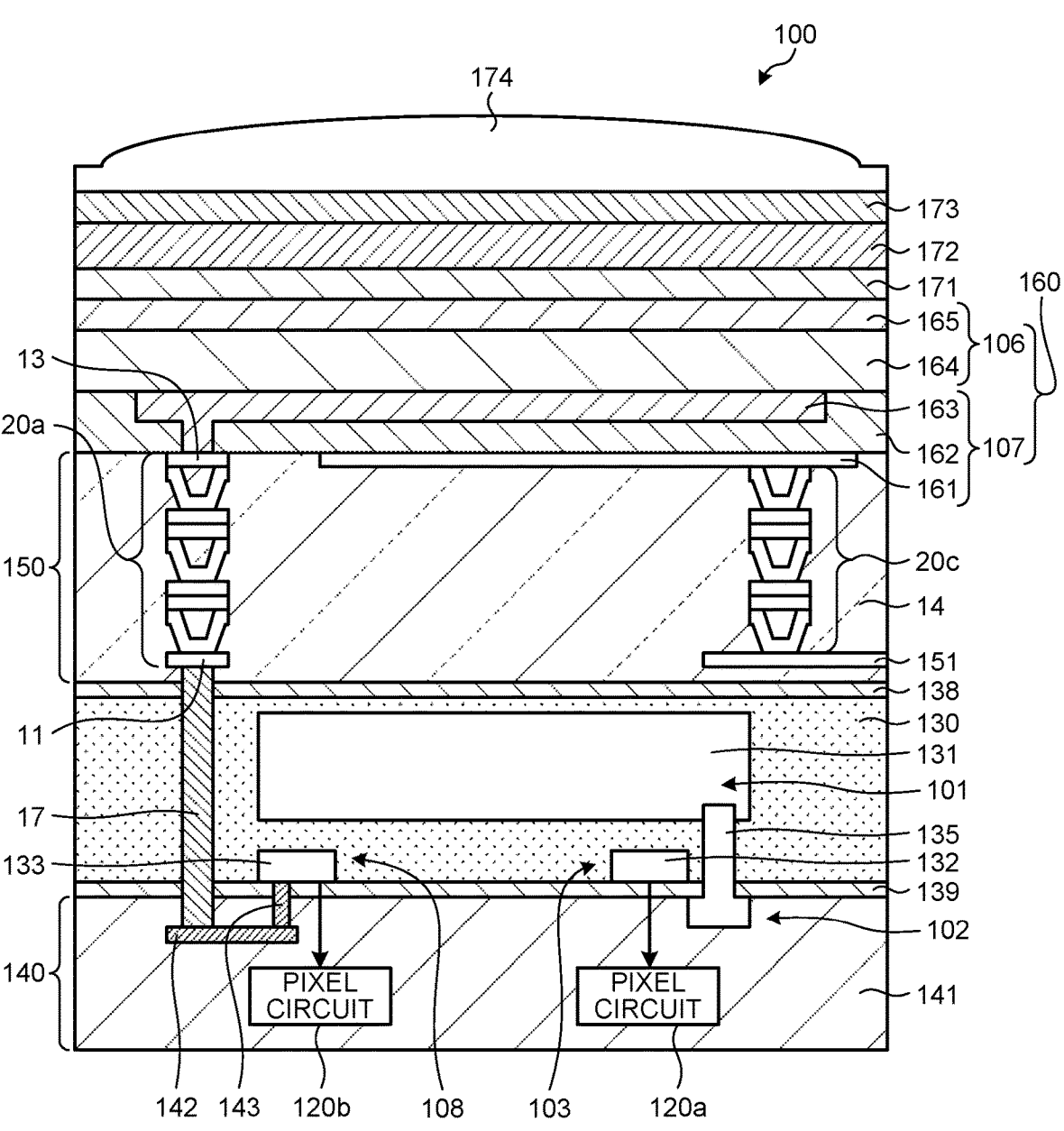
FIG. 13 is a sectional view illustrating a configuration example of the pixel of the imaging device to which the technology according to the present disclosure (present technology) may be applied.

FIG. 13 is a sectional view illustrating a configuration example of a pixel of an imaging device to which the technology according to the present disclosure (present technology) may be applied. The drawing is a sectional view illustrating a configuration example of the pixel 100. The pixel 100 in the drawing includes a semiconductor substrate 130, a wiring region 140, a transparent wiring region 150, a photoelectric conversion device 160, a sealing film 171, a color filter 172, a planarization film 173, and an on-chip lens 174.

The semiconductor substrate 130 is a semiconductor substrate on which devices such as the photoelectric conversion unit 101 are disposed. In the semiconductor substrate 130 in the drawing, the photoelectric conversion unit 101, the charge transfer unit 102, and the charge holding units 103 and 108 are illustrated. The semiconductor substrate 130 may be made of silicon (Si), for example. The photoelectric conversion unit 101 and the like are disposed in a well region formed in the semiconductor substrate 130. For convenience, the semiconductor substrate 130 in the drawing is assumed to constitute a p-type well region, for example. The devices may be formed by disposing an n-type semiconductor region in the p-type well region.

The rectangle described in the semiconductor substrate 130 in the drawing represents an n-type semiconductor region. The photoelectric conversion unit 101 includes an n-type semiconductor region 131. Specifically, a photodiode formed of a pn junction formed at an interface between the n-type semiconductor region 131 and a surrounding p-type well region corresponds to the photoelectric conversion unit 101.

The charge holding units 103 and 108 are formed of n-type semiconductor regions 132 and 133, respectively. These n-type semiconductor regions 132 and 133 constitute the above-described FD.

The charge transfer unit 102 includes semiconductor regions 131 and 132 and a gate electrode 135. The n-type semiconductor regions 131 and 132 correspond to the source region and the drain region of the charge transfer unit 102. The gate electrode 135 is disposed on the front surface side of the semiconductor substrate 130 and includes a columnar part having a depth reaching the n-type semiconductor region 131. When a drive voltage is applied to the gate electrode 135, a channel is formed in the well region adjacent to the gate electrode 135, and the n-type semiconductor regions 131 and 132 are brought into a conductive state. That is, the photoelectric conversion unit 101 and the charge holding unit 103 are electrically connected, and the charges of the photoelectric conversion unit 101 are transferred to the charge holding unit 103. In this manner, the charge transfer unit 102 is formed of a vertical transistor that transfers charges in a thickness direction of the semiconductor substrate.

The charge holding unit 108 holds the charges generated by the photoelectric conversion device 160. The charge holding unit 108 holds the charges transmitted via the through electrode 17, a wiring 142, and a contact plug 143 described later.

Image signals are generated by the pixel circuits 120a and 120b based on the charges held in the charge holding units 103 and 108, respectively.

Insulating films 138 and 139 are disposed on the semiconductor substrate 130. The insulating film 139 is a film that insulates the front surface side of the semiconductor substrate 130. The insulating film 138 is a film that insulates the back surface side of the semiconductor substrate 130. These films may be made of $SiO_2$ or SiN.

The wiring region 140 includes an insulating layer 141 and a wiring 142. The insulating layer 141 insulates the wiring 142 and the like. The insulating layer 141 may be made of $SiO_2$, for example. The wiring 142 is a conductor that transmits a signal or the like of the devices. The wiring 142 may be made of metal, such as W, Cu, or Al, for example. The wiring 142 and a semiconductor region 133 may be connected by the contact plug 143. The through electrode 17 is connected to the wiring 142. The through electrode 17 in the drawing is formed into a shape penetrating the semiconductor substrate 130.

The photoelectric conversion device 160 includes the wiring 13 constituting a first electrode, an insulating film 162, a transparent semiconductor layer 163, a photoelectric conversion film 164, a second electrode 165, and a control electrode 161. The photoelectric conversion film 164 is formed of an organic photoelectric conversion film, and it generates charges according to incident light. The second electrode 165 is a transparent conductive film disposed adjacent to the photoelectric conversion film 164. The transparent semiconductor layer 163 accumulates the charges generated by the photoelectric conversion film 164. The insulating film 162 is a film that insulates the photoelectric conversion film 164 and the transparent semiconductor layer 163. The control electrode 161 controls accumulation of charges in the transparent semiconductor layer 163. The second electrode 165 and the photoelectric conversion film 164 correspond to the photoelectric conversion unit 106 described in FIG. 12. The transparent semiconductor layer 163, the insulating film 162, the control electrode 161, and the wiring 13 correspond to the switching device 107 in FIG. 12. A wiring 151 is a transparent wiring connected to the signal line TG2.

The second electrode 165 is connected to the above-described power supply line Vou. Application of a control signal having a voltage higher than the bias voltage of the power supply line Vou to the control electrode 161 during an exposure period causes, for example, electrons among the charges generated in the photoelectric conversion film 164 to move to the transparent semiconductor layer 163 and accumulate. Application of a control signal having a voltage lower than the bias voltage of the power supply line Vou to the control electrode 161 after the lapse of the exposure period causes the charges accumulated in the transparent semiconductor layer 163 to move to the wiring 13 and transmit to the through electrode 17 through a wiring part 20a described later. A wiring part 20c described later transmits a control signal of the control electrode 161.

The transparent wiring region 150 is a wiring region disposed between the semiconductor substrate 130 and the photoelectric conversion device 160 and including transparent wiring. The transparent wiring region 150 includes the insulating layer 14, the wiring parts 20a and 20c, and the wiring 151. The wiring part 20a connects the wiring 13 and the through electrode 17 in the drawing. The wiring part 20c connects the control electrode 161 and the wiring 151. The pixel 100 is an example of an imaging device described in the claims.

The sealing film 171 seals the photoelectric conversion device 160. The color filter 172 is an optical filter that transmits light having a predetermined wavelength of incident light. The planarization film 173 planarizes the surface of the color filter 172. The on-chip lens 174 is a lens that collects incident light on the photoelectric conversion unit 101 and the photoelectric conversion device 160. The color filter 172 may also be disposed below the photoelectric conversion device 160.

Configuration of Plane of Pixel

Figure 14:
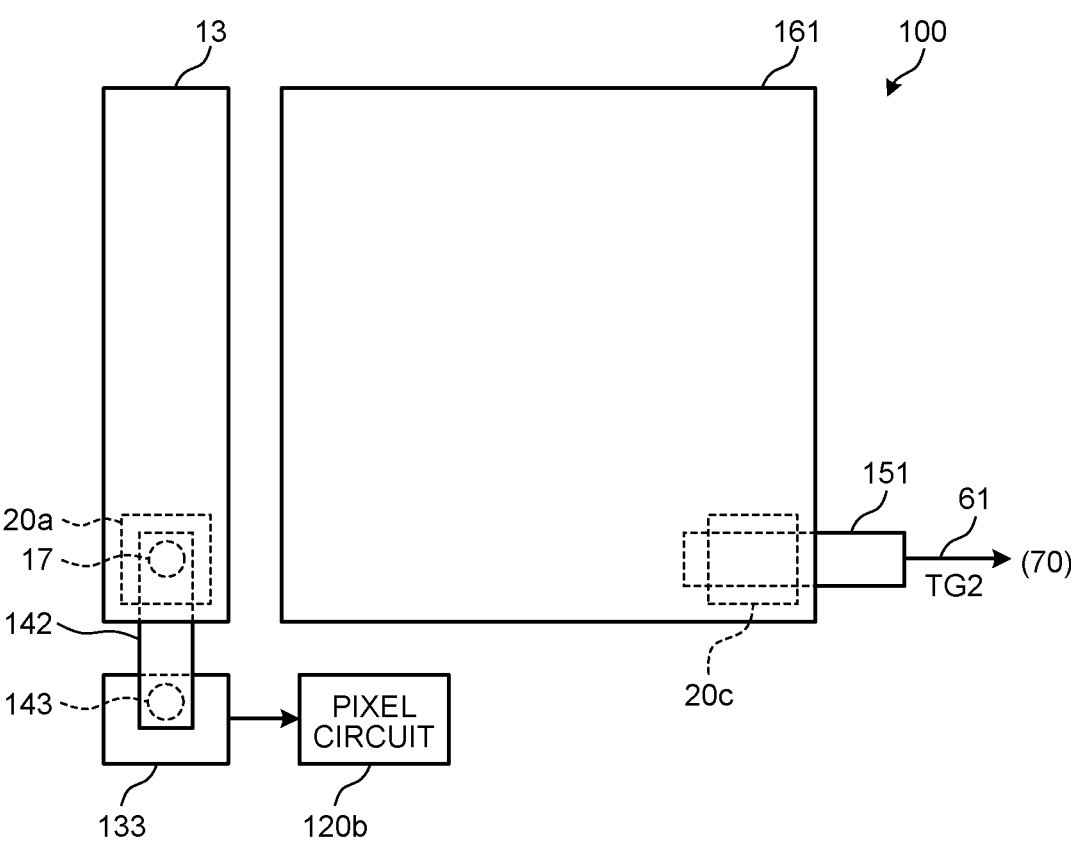
FIG. 14 is a plan view illustrating a configuration example of the pixel of the imaging device to which the technology according to the present disclosure (present technology) may be applied.

FIG. 14 is a plan view illustrating a configuration example of the pixel of the imaging device to which the technology according to the present disclosure (present technology) may be applied. The drawing is a plan view illustrating a configuration of the transparent wiring region 150 of the pixel 100.

The control electrode 161 having a substantially square shape is disposed in a central part of the pixel 100. The wiring part 20c is disposed at the lower right of the control electrode 161. The wiring 151 is connected to the wiring part 20c. The wiring 13 having a rectangular shape is disposed on the left of the control electrode 161. The wiring part 20a is disposed on the lower side of the wiring 13 in FIG. 14. The through electrode 17 is connected to the wiring part 20a. The wiring 142 is connected to the through electrode 17 and is connected to the semiconductor region 133 via the contact plug 143.

In this manner, disposing the transparent wiring part and the like in the pixel 100 enables incident light to be transmitted. It is possible to prevent a reduction of light entering the photoelectric conversion unit 101 of the semiconductor substrate 130.

The technology according to the present disclosure (the present technology) may also be applied to an electronic device including a light emitting device. For example, the present technology may also be applied to a display apparatus including an organic EL panel. In such a case, the wiring part according to the present disclosure is applied to the wiring connected to the organic EL panel.

The configuration of the second embodiment of the present disclosure may be applied to other embodiments. Specifically, the embedded part 16a in FIG. 4 may be applied to the third and fourth embodiments of the present disclosure.

The configuration of the third embodiment of the present disclosure may be applied to other embodiments. Specifically, the insulating layer 14a in FIG. 5 may be applied to the second and fourth to sixth embodiments of the present disclosure.

The configuration of the fourth embodiment of the present disclosure may be applied to other embodiments. Specifically, the protective film 22 in FIG. 6 may be applied to the second, third, fifth, and sixth embodiments of the present disclosure.

Effect

An electronic device includes an insulating layer 14, an interlayer connection wiring 12, and an upper layer wiring (wiring 13). The insulating layer 14 is disposed adjacent to a lower layer wiring (wiring 11) and includes a through hole 19. The interlayer connection wiring 12 is a transparent wiring that is connected to the lower layer wiring (wiring 11) in the through hole 19 and is formed into a shape extending to a surface side of the insulating layer 14. The upper layer wiring (wiring 13) is a transparent wiring that is stacked and connected to the interlayer connection wiring 12 extending to the surface side of the insulating layer 14. This configuration can form a wiring part in which the upper layer wiring is stacked on the lower layer wiring.

The electronic device may further include an embedded part 16 formed of a transparent member, the embedded part being disposed in a recess 15 of the interlayer connection wiring 12, the recess being formed according to the through hole 19, wherein the upper layer wiring (wiring 13) may be disposed adjacent to a surface of the embedded part 16. This configuration can fill the recess based on the through hole 19.

The embedded part 16 may be formed of an insulator. This configuration can insulate the embedded part 16.

The embedded part 16 may include any of silicon oxide ($SiO_2$), silicon nitride (SiN), silicon oxynitride (SiON), silicon oxycarbide (SiOC), fluorine-doped silicon oxide (SiOF), carbon-doped silicon oxide (SiOCH), niobium oxide ($Nb_2O_5$), hafnium oxide ($HfO_2$), boron silicate glass (BSG), and boron phosphorus silicate glass (BPSG).

The embedded part 16 may have a refractive index different from that of the insulating layer 14. This configuration can increase reflected light at the interface of the embedded part 16.

The embedded part 16 may be formed of a conductive member. This configuration can reduce the connection resistance of the wiring part.

The embedded part 16 may be formed of a member constituting the upper layer wiring (the wiring 13). This configuration can simplify the manufacturing process.

A plurality of two-layer wiring parts including the insulating layer 14, the interlayer connection wiring 12, and the upper layer wiring (wiring 13) may be stacked and disposed. This configuration can form a multilayer wiring.

The interlayer connection wiring 12 may have a refractive index different from that of the insulating layer 14. This configuration can increase reflected light at the interface of the interlayer connection wiring 12.

The insulating layer 14 may include the through hole 19 formed into a tapered shape. This configuration can prevent an increase in the connection resistance of the interlayer connection wiring 12.

The insulating layer 14 may include the through hole 19 formed into a tapered shape having an angle of 50 degrees or more. This configuration can reduce the size of the wiring part 10.

The electronic device may further include a second insulating layer (insulating layer 14a) disposed adjacent to the insulating layer 14 and adjacent to side surfaces of the interlayer connection wiring 12 and the upper layer wiring (wiring 13), the second insulating layer having a refractive index different from that of the insulating layer 14. This configuration can increase reflected light at the side surfaces of the interlayer connection wiring 12 and the upper layer wiring.

The interlayer connection wiring 12 may contain any of indium-tin oxide (ITO), indium-zinc oxide (IZO), tin oxide ($SnO_x$), zinc oxide ($ZnO_x$), titanium oxide ($TiO_x$), and carbon nanotube (CNT).

The upper layer wiring (the wiring 13) may contain any of indium-tin oxide (ITO), indium-zinc oxide (IZO), tin oxide ($SnO_x$), zinc oxide ($ZnO_x$), titanium oxide ($TiO_x$), and carbon nanotube (CNT).

The electronic device may further include a protective film 22 disposed between the insulating layer 14 and at least one of the lower layer wiring (wiring 11) and the upper layer wiring (wiring 13). This configuration can simplify the manufacturing process.

The electronic device may further include a transparent lower layer wiring (wiring 11).

The lower layer wiring (wiring 11) may be formed into a shape in which another wiring is embedded in a bottom surface. This configuration can reduce the connection resistance.

The electronic device may further include an imaging device that generates an image signal based on incident light, wherein the upper layer wiring (wiring 13) may transmit a signal to the imaging device. This configuration can prevent a reduction of incident light in an electronic device having an imaging device.

The electronic device may further include a two-layer wiring part configured including the insulating layer 14, the interlayer connection wiring 12, and the upper layer wiring (wiring 13) and disposed around the imaging device. This configuration can improve the sensitivity of the pixels.

A method for manufacturing an electronic device is a method including: a step of forming a through hole 19 in an insulating layer 14 disposed adjacent to a lower layer wiring (wiring 11); a step of forming a transparent interlayer connection wiring 12 connected to the lower layer wiring (wiring 11) in the formed through hole 19, the interlayer connection wiring 12 being formed into a shape extending to a surface side of the insulating layer 14; and a step of forming a transparent upper layer wiring (wiring 13) stacked on and connected to a part of the formed interlayer connection wiring 12, the part extending to the surface side of the insulating layer 14. This configuration can manufacture a wiring part in which the upper layer wiring is stacked on the lower layer wiring.

The effects described in the present specification are merely examples and are not restrictive of the disclosure herein, and other effects may be achieved.

The present technology may also take the following configurations.

(1)

An electronic device comprising:

an insulating layer disposed adjacent to a lower layer wiring, the insulating layer including a through hole;

a transparent interlayer connection wiring connected to the lower layer wiring in the through hole, the interlayer connection wiring formed into a shape extending to a surface side of the insulating layer; and a transparent upper layer wiring stacked on and connected to the interlayer connection wiring extending to the surface side of the insulating layer.

(2)

The electronic device according f the above (1), further comprising an embedded part formed of a transparent member, the embedded part being disposed in a recess of the interlayer connection wiring, the recess being formed according to the through hole, wherein the upper layer wiring is disposed adjacent to a surface of the embedded part.

(3)

The electronic device according to the above (2), wherein the embedded part is formed of an insulator.

(4)

The electronic device according to the above (3), wherein the embedded part includes any of silicon oxide ($SiO_2$), silicon nitride (SiN), silicon oxynitride (SiON), silicon oxycarbide (SiOC), fluorine-doped silicon oxide (SiOF), carbon-doped silicon oxide (SiOCH), niobium oxide ($Nb_2O_5$), hafnium oxide ($HfO_2$), boron silicate glass (BSG), and boron phosphorus silicate glass (BPSG).

(5)

The electronic device according to the above (3), wherein the embedded part has a refractive index different from a refractive index of the insulating layer.

(6)

The electronic device according to the above (2), wherein the embedded part is formed of a conductive member.

(7)

The electronic device according to the above (6), wherein the embedded part is formed of a member constituting the upper layer wiring.

(8)

The electronic device according to any one of the above (1) to (7), wherein a plurality of two-layer wiring parts including the insulating layer, the interlayer connection wiring, and the upper layer wiring are stacked and disposed.

(9)

The electronic device according to any one of the above (1) to (8), wherein the interlayer connection wiring has a refractive index different from a refractive index of the insulating layer.

(10)

The electronic device according to any one of the above (1) to (9), wherein the insulating layer includes the through hole formed into a tapered shape.

(11)

The electronic device according to the above (10), wherein the insulating layer includes the through hole formed into a tapered shape having an angle of 50 degrees or more.

(12)

The electronic device according to any one of the above (1) to (11), further comprising a second insulating layer disposed adjacent to the insulating layer and adjacent to side surfaces of the interlayer connection wiring and the upper layer wiring, the second insulating layer having a refractive index different from a refractive index of the insulating layer.

(13)

The electronic device according to any one of the above (1) to (12), wherein the interlayer connection wiring includes any of indium-tin oxide (ITO), indium-zinc oxide (IZO), tin oxide ($SnO_x$), zinc oxide ($ZnO_x$), titanium oxide ($TiO_x$), and carbon nanotube (CNT).

(14)

The electronic device according to any one of the above (1) to (13), wherein the upper layer wiring includes any of indium-tin oxide (ITO), indium-zinc oxide (IZO), tin oxide ($SnO_x$), zinc oxide ($ZnO_x$), titanium oxide ($TiO_x$), and carbon nanotube (CNT).

(15)

The electronic device according to any one of the above (1) to (14), further comprising a protective film disposed between the insulating layer and at least one of the lower layer wiring and the upper layer wiring.

(16)

The electronic device according to any one of the above (1) to (15), further comprising a transparent lower layer wiring.

(17)

The electronic device according to the above (16), wherein the lower layer wiring is formed into a shape in which another wiring is embedded in a bottom surface.

(18)

The electronic device according to any one of the above (1) to (17), further comprising an imaging device that generates an image signal based on incident light, wherein the upper layer wiring transmits a signal to the imaging device.
(19)

The electronic device according to the above (18), further comprising a two-layer wiring part including the insulating layer, the interlayer connection wiring, and the upper layer wiring and disposed around the imaging device.
(20)

A method for manufacturing an electronic device, the method comprising:

a step of forming a through hole in an insulating layer disposed adjacent to a lower layer wiring;

a step of forming a transparent interlayer connection wiring connected to the lower layer wiring in the formed through hole, the interlayer connection wiring being formed into a shape extending to a surface side of the insulating layer; and a step of forming a transparent upper layer wiring stacked on and connected to a part of the formed interlayer connection wiring, the part extending to the surface side of the insulating layer.

REFERENCE SIGNS LIST

1 IMAGING DEVICE
10, 10a WIRING PART
11, 13, 151 WIRING
12 INTERLAYER CONNECTION WIRING
14, 14a INSULATING LAYER
15 RECESS
16, 16a EMBEDDED PART
17 THROUGH ELECTRODE
19 THROUGH HOLE
20a, 20b, 20c WIRING PART
21, 22 PROTECTIVE FILM
100 PIXEL
101, 106 PHOTOELECTRIC CONVERSION UNIT
103, 108 CHARGE HOLDING UNIT
107 SWITCHING DEVICE
130 SEMICONDUCTOR SUBSTRATE
150 TRANSPARENT WIRING REGION
160 PHOTOELECTRIC CONVERSION DEVICE
161 CONTROL ELECTRODE
162 INSULATING FILM
163 TRANSPARENT SEMICONDUCTOR LAYER
164 PHOTOELECTRIC CONVERSION FILM
165 FIRST ELECTRODE

The invention claimed is:

1. An electronic device, comprising:
a first insulating layer disposed adjacent to a lower layer wiring, the first insulating layer including a through hole;
a transparent interlayer connection wiring connected to the lower layer wiring in the through hole, wherein the transparent interlayer connection wiring has a shape that extends to a surface side of the first insulating layer;
a transparent upper layer wiring stacked on and connected to the transparent interlayer connection wiring that extends to the surface side of the first insulating layer, wherein the transparent upper layer wiring is connected to the transparent interlayer connection wiring; and
a second insulating layer adjacent to the first insulating layer and adjacent to a side surface of the transparent interlayer connection wiring and a side surface of the transparent upper layer wiring, wherein the second insulating layer has a refractive index different from a refractive index of the first insulating layer.

2. The electronic device according to claim 1, further comprising an embedded part that includes a transparent member, wherein the embedded part is in a recess of the transparent interlayer connection wiring, formation of the recess is based on the through hole, and wherein the transparent upper layer wiring is adjacent to a surface of the embedded part.

3. The electronic device according to claim 2, wherein the embedded part includes an insulator.

4. The electronic device according to claim 3, wherein the embedded part includes one of silicon oxide (SiO$_2$), silicon nitride (SIN), silicon oxynitride (SiON), silicon oxycarbide (SiOC), fluorine-doped silicon oxide (SiOF), carbon-doped silicon oxide (SiOCH), niobium oxide (Nb$_2$O$_5$), hafnium oxide (HfO$_2$), boron silicate glass (BSG), or boron phosphorus silicate glass (BPSG).

5. The electronic device according to claim 3, wherein the embedded part has a refractive index different from the refractive index of the first insulating layer.

6. The electronic device according to claim 2, wherein the embedded part includes a conductive member.

7. The electronic device according to claim 6, wherein the embedded part includes a member that constitutes the transparent upper layer wiring.

8. The electronic device according to claim 1, further comprising a plurality of two-layer wiring parts including the first insulating layer, the transparent interlayer connection wiring, and the transparent upper layer wiring in a stacked arrangement.

9. The electronic device according to claim 1, wherein the transparent interlayer connection wiring has a refractive index different from the refractive index of the first insulating layer.

10. The electronic device according to claim 1, wherein the through hole has a tapered shape.

11. The electronic device according to claim 10, wherein the through hole has the tapered shape having an angle of at least 50 degrees.

12. The electronic device according to claim 1, wherein the transparent interlayer connection wiring includes one of indium-tin oxide (ITO), indium-zinc oxide (IZO), tin oxide (SnO$_x$), zinc oxide (ZnO$_x$), titanium oxide (TiO$_x$), or carbon nanotube (CNT).

13. The electronic device according to claim 1, wherein the transparent upper layer wiring includes one of indium-tin oxide (ITO), indium-zinc oxide (IZO), tin oxide (SnO$_x$), zinc oxide (ZnO$_x$), titanium oxide (TiO$_x$), or carbon nanotube (CNT).

14. The electronic device according to claim 1, further comprising a protective film disposed between the first insulating layer and at least one of the lower layer wiring and the transparent upper layer wiring.

15. The electronic device according to claim 1, further comprising a transparent lower layer wiring.

16. The electronic device according to claim 15, wherein the transparent lower layer wiring has a shape in which a specific wiring is embedded in a bottom surface.

17. The electronic device according to claim 1, further comprising an imaging device configured to generate an image signal based on incident light, wherein the transparent upper layer wiring is configured to transmit a signal to the imaging device.

18. The electronic device according to claim 17, further comprising a two-layer wiring part including the first insulating layer, the transparent interlayer connection wiring, and the transparent upper layer wiring, wherein the two-layer wiring part is around the imaging device.

\* \* \* \* \*